US010016956B2

(12) United States Patent
Terasaki et al.

(10) Patent No.: US 10,016,956 B2
(45) Date of Patent: Jul. 10, 2018

(54) CU/CERAMIC BONDED BODY, METHOD FOR MANUFACTURING CU/CERAMIC BONDED BODY, AND POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 168 days.

(21) Appl. No.: 15/021,460

(22) PCT Filed: Sep. 25, 2014

(86) PCT No.: PCT/JP2014/075339
§ 371 (c)(1),
(2) Date: Mar. 11, 2016

(87) PCT Pub. No.: WO2015/046280
PCT Pub. Date: Apr. 2, 2015

(65) Prior Publication Data
US 2016/0221305 A1     Aug. 4, 2016

(30) Foreign Application Priority Data
Sep. 30, 2013     (JP) ................. 2013-204060

(51) Int. Cl.
| B32B 9/00 | (2006.01) |
| H01L 25/07 | (2006.01) |
| H01L 25/18 | (2006.01) |
| C04B 37/02 | (2006.01) |
| H01L 23/373 | (2006.01) |
| B32B 9/04 | (2006.01) |
| B32B 15/20 | (2006.01) |
| B32B 7/12 | (2006.01) |
| H01L 23/40 | (2006.01) |
| H01L 23/473 | (2006.01) |

(52) U.S. Cl.
CPC ............... *B32B 9/005* (2013.01); *B32B 7/12* (2013.01); *B32B 9/041* (2013.01); *B32B 15/20* (2013.01); *C04B 37/026* (2013.01); *H01L 23/3736* (2013.01); *H01L 25/07* (2013.01); *H01L 25/18* (2013.01); *B32B 2264/105* (2013.01); *B32B 2457/14* (2013.01); *B32B 2457/18* (2013.01); *B32B 2605/00* (2013.01); *C04B 2235/6567* (2013.01); *C04B 2237/125* (2013.01); *C04B 2237/127* (2013.01); *C04B 2237/343* (2013.01); *C04B 2237/345* (2013.01); *C04B 2237/36* (2013.01); *C04B 2237/366* (2013.01); *C04B 2237/407* (2013.01); *C04B 2237/55* (2013.01); *C04B 2237/60* (2013.01); *C04B 2237/704* (2013.01); *C04B 2237/706* (2013.01); *C04B 2237/708* (2013.01); *C04B 2237/72* (2013.01); *H01L 23/3735* (2013.01); *H01L 23/4006* (2013.01); *H01L 23/473* (2013.01); *H01L 2023/4062* (2013.01); *H01L 2224/32225* (2013.01); *H01L 2924/0002* (2013.01)

(58) Field of Classification Search
CPC ........................................... B32B 9/005
USPC ........................................ 428/328
See application file for complete search history.

(56) References Cited

U.S. PATENT DOCUMENTS

| 6,071,592 A | 6/2000 | Sakuraba et al. | |
| 6,531,100 B1* | 3/2003 | Ogata ............ | B01J 35/002 422/177 |
| 8,257,662 B2* | 9/2012 | Jin ............... | B01J 35/0006 422/211 |
| 2014/0318831 A1* | 10/2014 | Nishikawa ...... | H01L 23/36 174/252 |

FOREIGN PATENT DOCUMENTS

| CN | 1364748 A | 8/2002 |
| JP | 63-257294 A | 10/1988 |
| JP | 03-261669 A | 11/1991 |
| JP | 04-162756 A | 6/1992 |
| JP | 05-070260 A | 3/1993 |
| JP | 05-246769 A | 9/1993 |
| JP | 06-024854 A | 2/1994 |
| JP | 06-048852 A | 2/1994 |
| JP | 09-283671 A | 10/1997 |
| JP | 3211856 B2 | 9/2001 |
| TW | 457163 B | 10/2001 |
| TW | 200408489 A | 6/2004 |
| TW | 200815623 A | 4/2008 |
| WO | 2013/094213 A1 | 6/2013 |
| WO | 2013/115359 A1 | 8/2013 |

OTHER PUBLICATIONS

CN 1830549, Chen Y., abstract, Photocatalyst material for optical redox reaction comprises alcohol, water, titanium dioxide nano-particles, disperser, inorganic adhesive and silver nano-particle. (Year: 2006).*

(Continued)

*Primary Examiner* — Terressa Boykin
(74) *Attorney, Agent, or Firm* — Locke Lord LLP; James E. Armstrong, IV; Nicholas J. DiCeglie, Jr.

(57) ABSTRACT

A Cu/ceramic bonded body according to the present invention is formed by bonding a copper member made of copper or a copper alloy and a ceramic member made of AlN or $Al_2O_3$ using a bonding material containing Ag and Ti, in which a Ti compound layer made of a Ti nitride or a Ti oxide is formed at a bonding interface between the copper member and the ceramic member, and Ag particles are dispersed in the Ti compound layer.

23 Claims, 15 Drawing Sheets

(56) References Cited

OTHER PUBLICATIONS

Office Action dated Sep. 20, 2016, issued for the Chinese patent application No. 201480044605.9 and English translation thereof.
International Search Report dated Nov. 18, 2014, issued for PCT/JP2014/075339 and English translation thereof.
Office Action dated Jun. 24, 2016, issued for the Taiwanese patent application No. 103133314 and English translation thereof.
Supplementary European Search Report dated Jun. 21, 2017, issued for the European patent application No. 14849002.2.

* cited by examiner

CU/CERAMIC BONDED BODY, METHOD FOR MANUFACTURING CU/CERAMIC BONDED BODY, AND POWER MODULE SUBSTRATE

CROSS REFERENCE TO RELATED APPLICATIONS

This Application is a 35 U.S.C. § 371 National Phase Application of International PCT Patent Application No. PCT/JP2014/075339, filed on Sep. 25, 2014, which claims the benefit of and priority to Japanese Patent Application Serial No. JP 2013-204060, filed Sep. 30, 2013, the entire contents of each of which are hereby incorporated by reference herein in their entirety.

TECHNICAL FIELD

The present invention relates to a Cu/ceramic bonded body formed by bonding a copper member made of copper or a copper alloy and a ceramic member made of AlN or $Al_2O_3$, a method for manufacturing the Cu/ceramic bonded body, and a power module substrate made of the Cu/ceramic bonded body.

Priority is claimed on Japanese Patent Application No. 2013-204060, filed Sep. 30, 2013, the content of which is incorporated herein by reference.

BACKGROUND ART

A semiconductor device such as an LED or a power module has a structure in which a semiconductor element is bonded to a circuit layer made of a conductive material.

A power semiconductor element for controlling higher amounts of power used to control wind power generation, electric automobiles, hybrid automobiles, and the like generates a large amount of heat. Therefore, as a substrate on which such a power semiconductor element is mounted, for example, a power module substrate including a ceramic substrate made of AlN (aluminum nitride), $Al_2O_3$ (alumina), and the like, and a circuit layer formed by bonding a metal plate having excellent conductivity to one surface of the ceramic substrate has been widely used until now. As the power module substrate, a substrate having a metal layer formed by bonding a metal plate to the other surface of the ceramic substrate is also provided.

For example, PTL 1 proposes a power module substrate in which a first metal plate and a second metal plate which constitute a circuit layer and a metal layer are copper plates, and these copper plates are directly bonded to a ceramic substrate using a DBC method. In the DBC method, by utilizing a eutectic reaction between copper and a copper oxide, a liquid phase is formed at the interface between the copper plate and the ceramic substrate to bond the copper plate to the ceramic substrate.

Further, PTL 2 proposes a power module substrate in which a circuit layer and a metal layer are formed by bonding copper plates to one surface and the other surface of a ceramic substrate. In the power module substrate, the copper plates are bonded to the ceramic substrate by performing a heating treatment in a state in which the copper plates are arranged on one surface and the other surface of the ceramic substrate via a Ag—Cu—Ti-based brazing filler metal (a so-called active metal brazing method). In the active metal brazing method, since a brazing filler metal containing Ti which is an active metal is used, the wettability between the melted brazing filler metal and the ceramic substrate is improved and the ceramic substrate and the copper plates are bonded in a satisfactory manner.

CITATION LIST

Patent Documents

[PTL 1] Japanese Unexamined Patent Application, First Publication No. H04-162756
[PTL 2] Japanese Patent No. 3211856

DISCLOSURE OF INVENTION

Technical Problem

However, as disclosed in PTL 1, in the case in which a ceramic substrate and copper plates are bonded by a DBC method, it is required to set the bonding temperature to 1,065° C. or higher (the eutectic point temperature of copper and a copper oxide or higher). Therefore, in the DBC method, there is a concern of deterioration of the ceramic substrate at the time of bonding.

In addition, as disclosed in PTL 2, in the case in which a ceramic substrate and copper plates are bonded by an active metal brazing method, it is required to set the bonding temperature to a relatively high temperature of 900° C. Therefore, there is also a problem of deterioration of the ceramic substrate in the active metal brazing method. Herein, when the bonding temperature is lowered, the brazing filler metal does not sufficiently react with the ceramic substrate and the bonding rate at the interface between the ceramic substrate and the copper plate is decreased. Thus, it is not possible to provide a power module substrate having high reliability.

The present invention has been made in consideration of the aforementioned circumstances, and an object thereof is to provide a Cu/ceramic bonded body in which a copper member and a ceramic member are reliably bonded, a method for manufacturing the Cu/ceramic bonded body, and a power module substrate made of the Cu/ceramic bonded body.

Solution to Problem

In order to solve such problems and achieve the aforementioned object, there is provided a Cu/ceramic bonded body according to a first aspect of the present invention formed by bonding a copper member made of copper or a copper alloy and a ceramic member made of AlN or $Al_2O_3$ using a bonding material containing Ag and Ti, in which a Ti compound layer made of a Ti nitride or a Ti oxide is formed at a bonding interface between the copper member and the ceramic member, and Ag particles are dispersed in the Ti compound layer.

The Cu/ceramic bonded body having the configuration has a structure in which a copper member made of copper or a copper alloy and a ceramic member made of AlN or $Al_2O_3$ are bonded using a bonding material containing Ag and Ti, and a Ti compound layer is formed at a bonding interface between the copper member and the ceramic member. Here, when the ceramic member is made of AlN, a Ti compound layer made of a Ti nitride is formed at the bonding interface between the copper member and the ceramic member. In addition, when the ceramic member is made of $Al_2O_3$, a Ti compound layer made of a Ti oxide is formed at the bonding interface between the copper member and the ceramic member. These Ti compound layers are formed by the reaction of Ti in the boding material with oxygen or nitrogen in the ceramic member.

In the Cu/ceramic bonded body according to the first aspect of the present invention, Ag particles are dispersed in the Ti compound layer. It is assumed that the Ag particles are formed in the process of forming the aforementioned Ti compound layer by the reaction of Ti with nitrogen or oxygen in a liquid phase formed by the eutectic reaction Ag between Al. That is, by holding a temperature under a low temperature condition in which the temperature is equal to or higher than the eutectic point temperature of Ag and Al (567° C.), the Ti compound is easily formed and the aforementioned Ti compound layer is sufficiently formed. As a result, it is possible to obtain a Cu/ceramic bonded body in which the copper member and the ceramic member are reliably bonded.

In the Cu/ceramic bonded body according to the first aspect of the present invention, the concentration of Ag in a near interface region from the interface with the ceramic member to 500 nm in the Ti compound layer may be 0.3 atomic % or more.

In this case, since the Ag particles are sufficiently dispersed in the Ti compound layer, formation of the Ti compound is promoted and the Ti compound layer is sufficiently formed. As a result, the copper member and the ceramic member are bonded strongly together.

In addition, in the Cu/ceramic bonded body according to the first aspect of the present invention, the particle size of the Ag particles dispersed in the Ti compound layer may be in a range from 10 nm to 100 nm.

In this case, since the Ag particles dispersed in the Ti compound layer have a relatively fine particle size of 10 nm or more and 100 nm or less and are formed in the process of forming the aforementioned Ti compound layer by the reaction of Ti with nitrogen or oxygen, formation of the Ti compound is promoted and the Ti compound layer is sufficiently formed. As a result, it is possible to obtain a Cu/ceramic bonded body in which a copper member and a ceramic member are reliably bonded.

Further, in the Cu/ceramic bonded body according to the first aspect of the present invention, the bonding material may further contain Cu and Cu particles may be dispersed in the Ti compound layer.

In this case, since the bonding material contains Cu in addition to Ag and Ti, and Cu particles are dispersed in the Ti compound layer, the Ti compound layer is sufficiently formed on the surface of the ceramic member. As a result, it is possible to obtain a Cu/ceramic bonded body in which a copper member and a ceramic member are reliably bonded.

A method for manufacturing a Cu/ceramic bonded body according to a second aspect of the present invention is a method for manufacturing the aforementioned Cu/ceramic bonded body and the method includes a low temperature holding step of holding a temperature in a temperature range from a eutectic point temperature of Ag and Al to a temperature lower than a eutectic point temperature of Ag and Cu in a state in which a bonding material containing Ag and Ti is interposed between the copper member and the ceramic member, a heating step of, after the low temperature holding step, performing heating to a temperature equal to or higher than the eutectic point temperature of Ag and Cu to melt the bonding material, and a cooling step of, after the heating step, performing cooling and solidifying the melted bonding material to bond the copper member to the ceramic member.

According to the method for manufacturing a Cu/ceramic bonded body having the configuration, since the method includes a low temperature holding step of holding a temperature in a temperature range from a eutectic point temperature of Ag and Al to a temperature lower than a eutectic point temperature of Ag and Cu in a state in which a bonding material containing Ag and Ti is interposed between the copper member and the ceramic member, a liquid phase is formed at the interface between the copper member and the ceramic member by a eutectic reaction between Al and Ag through the low temperature holding step. Al used in the reaction is supplied from AlN or $Al_2O_3$ constituting the ceramic member and Ti contained in the bonding material reacts with nitrogen or oxygen to form a Ti compound layer on the surface of the ceramic member. In the process, Ag particles are dispersed in the Ti compound layer.

Here, since the holding temperature in the low temperature holding step is set to the eutectic point temperature of Ag and Al or higher, a liquid phase can be reliably formed at the interface between the copper member and the ceramic member by a eutectic reaction between Al and Ag. In addition, since the holding temperature in the low temperature holding step is set to a temperature lower than the eutectic point temperature of Ag and Cu, Ag which reacts with Al can be secured without consuming Ag by the reaction with Cu. As a result, it is possible to reliably form a liquid phase by the eutectic reaction between Al and Ag.

After the low temperature holding step, the method includes a heating step of performing heating to a temperature equal to or higher than the eutectic point temperature of Ag and Cu to melt the bonding material, and a cooling step of performing cooling and solidifying the melted bonding material to bond the copper member to the ceramic member. As a result, even when the heating temperature in the heating step is a low temperature, in a state in which the Ti compound layer is sufficiently formed, the bonding material is melted and thus the ceramic member and the copper member can be reliably bonded.

In the method for manufacturing a Cu/ceramic bonded body according to the second embodiment of the present invention, it is preferable that the holding time in the low temperature holding step be in a range from 30 minutes to 5 hours.

In this case, since the holding time in the low temperature holding step is set to 30 minutes or more, the Ti compound layer is sufficiently formed and the ceramic member and the copper member can be reliably bonded.

On the other hand, since the holding time in the low temperature holding step is 5 hours or less, the amount of energy consumed can be reduced.

In the method for manufacturing a Cu/ceramic bonded body according to the second embodiment of the present invention, it is preferable that the heating temperature in the heating step be in a range from 790° C. to 830° C.

In this case, since the heating temperature in the heating step is set to a relatively low temperature in a range from 790° C. to 830° C. thermal load on the ceramic member at the time of bonding can be reduced and deterioration of the ceramic member can be limited. In addition, as described above, the method includes the low temperature holding step, even in the case in which the heating temperature in the heating step is a relatively low temperature, the ceramic member and the copper member can be reliably bonded.

A power module substrate according to a third aspect of the present invention is a power module substrate formed by bonding a copper plate made of copper or a copper alloy to a surface of a ceramic substrate made of AlN or $Al_2O_3$ and includes the Cu/ceramic bonded body.

According to the power module substrate having the configuration, since the substrate includes the Cu/ceramic bonded body, thermal load on the ceramic substrate can be reduced by performing bonding under a low temperature condition and deterioration of the ceramic substrate can be limited. In addition, even when bonding is performed under a low temperature condition, the ceramic substrate and the copper plate are reliably bonded and thus bonding reliability can be secured. The copper plate bonded to the surface of the ceramic substrate is used as a circuit layer or a metal layer.

Advantageous Effects of Invention

According to the present invention, it is possible to provide a Cu/ceramic bonded body in which a copper member and a ceramic member are reliably bonded, a method for manufacturing the Cu/ceramic bonded body, and a power module substrate made of the Cu/ceramic bonded body.

BEST MODE FOR CARRYING OUT THE INVENTION

Embodiments of the present invention will be described below with reference to the appended drawings.
(First Embodiment)
First, a first embodiment of the present invention will be described with reference to FIGS. 1 to 5.

A Cu/ceramic bonded body according to the embodiment includes a power module substrate 10 formed by bonding a ceramic substrate 11 which is a ceramic member and a copper plate 22 (circuit layer 12) which is a copper member.

Figure 1:
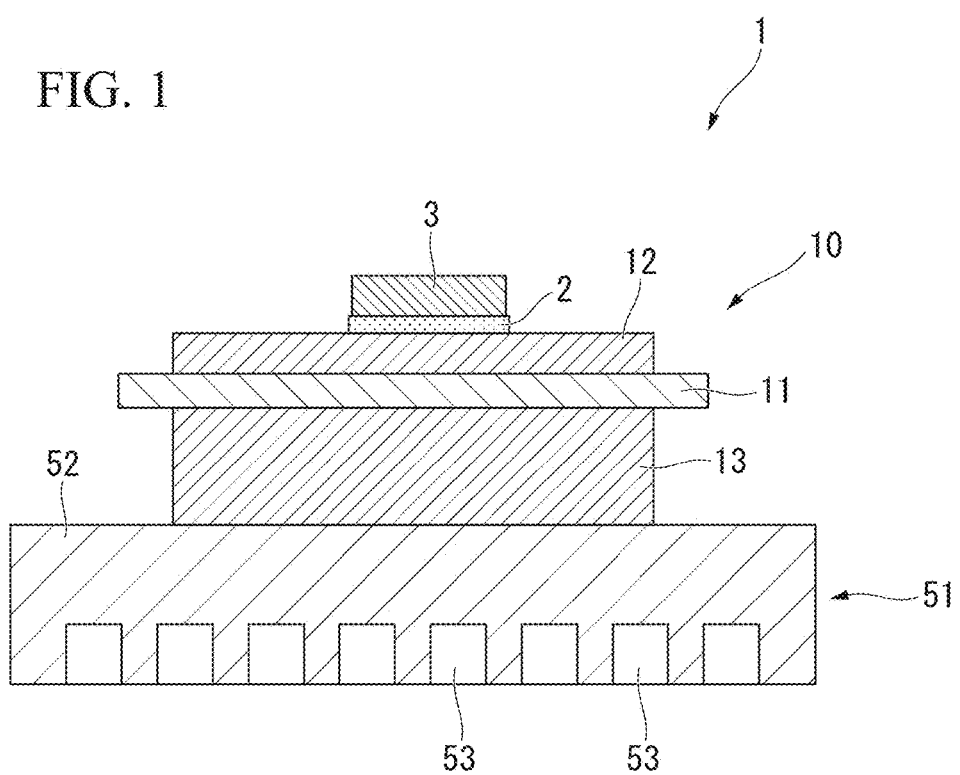
FIG. 1 is a schematic explanatory diagram of a power module using a power module substrate according to a first embodiment of the present invention.

In FIG. 1, the power module substrate 10 according to the first embodiment of the present invention and a power module 1 using the power module substrate 10 are shown.

The power module 1 includes the power module substrate 10, a semiconductor element 3 that is bonded to one side (upper side in FIG. 1) of the power module substrate 10 via a solder layer 2, and a heat sink 51 that is arranged on the other side (lower side in FIG. 1) of the power module substrate 10.

Here, for example, the solder layer 2 is made of a Sn—Ag-based, Sn—In-based, or Sn—Ag—Cu-based solder material.

The power module substrate 10 includes the ceramic substrate 11, the circuit layer 12 that is arranged on one surface (upper surface in FIG. 1) of the ceramic substrate 11, and a metal layer 13 that is arranged on the other surface (lower surface in FIG. 1) of the ceramic substrate 11.

The ceramic substrate 11 prevents electrical connection between the circuit layer 12 and the metal layer 13, and is made of AlN (aluminum nitride) having high insulating properties in the embodiment. Here, the thickness of the ceramic substrate 11 is set to be in a range from 0.2 mm to 1.5 mm and is set to 0.635 mm in the embodiment.

Figure 4:
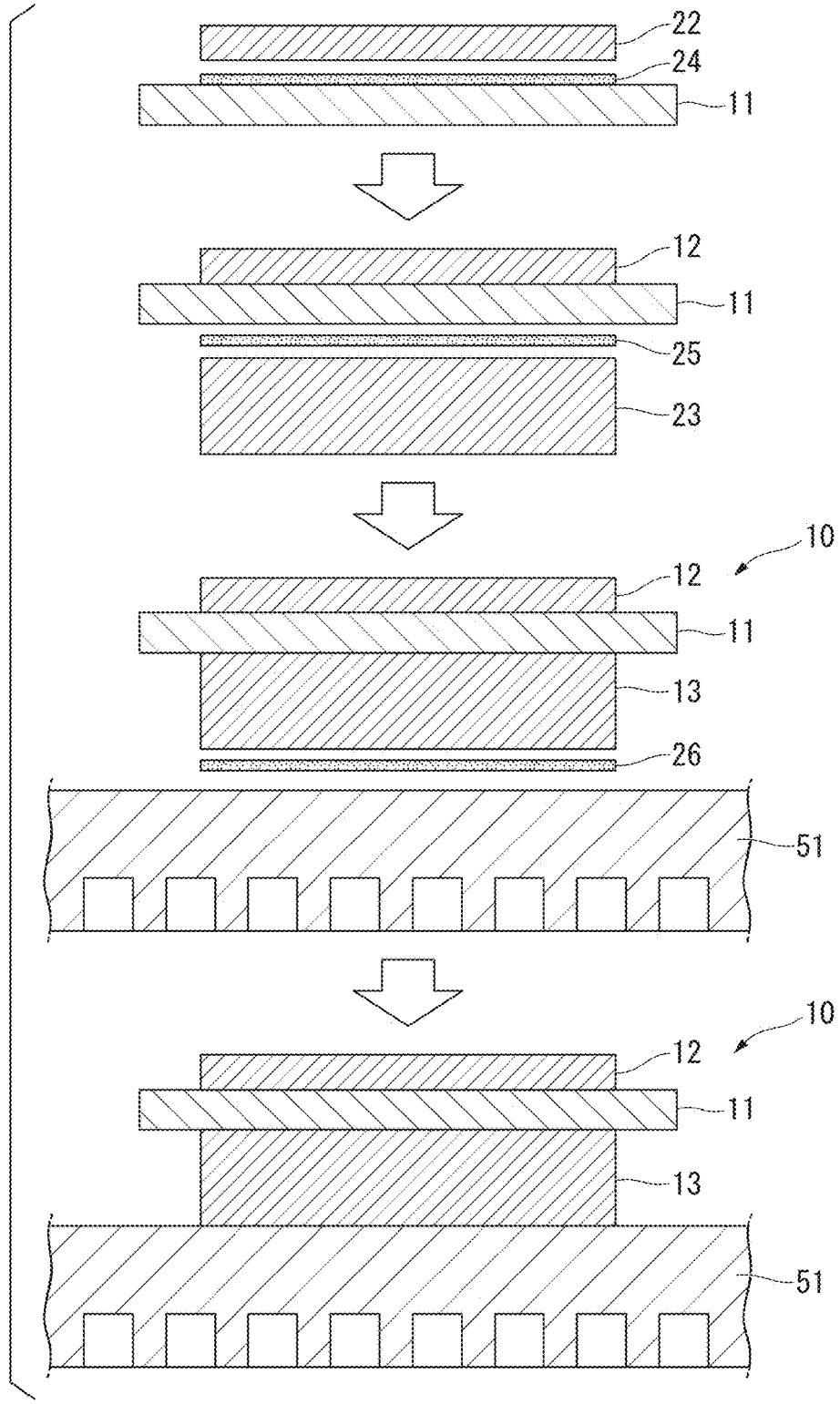
FIG. 4 is an explanatory diagram showing the method for manufacturing the power module substrate according to the first embodiment of the present invention.

As shown in FIG. 4, the circuit layer 12 is formed by bonding the copper plate 22 made of copper or a copper alloy to one surface of the ceramic substrate 11. In the embodiment, as the copper plate 22 constituting the circuit layer 12, a rolled sheet of oxygen-free copper is used. A circuit pattern is formed on the circuit layer 12 and one surface (upper surface in FIG. 1) of the circuit layer is a surface on which the semiconductor element 3 is mounted. Here, the thickness of the circuit layer 12 is set to be in a range from 0.1 mm to 1.0 mm and is set to 0.6 mm in the embodiment.

As shown in FIG. 4, the metal layer 13 is formed by bonding an aluminum plate 23 to the other surface of the ceramic substrate 11. In the embodiment, the metal layer 13 is formed by bonding an aluminum plate 23 made of a rolled sheet of aluminum with a purity of 99.99 mass % or more (so-called 4N aluminum) to the ceramic substrate 11.

The aluminum plate 23 has a 0.2% proof stress of 30 $N/mm^2$ or less. Here, the thickness of the metal layer 13 (aluminum plate 23) is set to be in a range from 0.5 mm to 6 mm, and is set to 2.0 mm in the embodiment.

The heat sink 51 cools the aforementioned power module substrate 10 and is configured to have a top plate portion 52 which is bonded to the power module substrate 10 and a channel 53 through which a cooling medium (for example, cooling water) is circulated. The heat sink 51 (top plate portion 52) is preferably made of a material having good thermal conductivity and is made of A6063 (an aluminum alloy) in the embodiment.

In the embodiment the heat sink 51 (top plate portion 52) is directly bonded to the metal layer 13 of the power module substrate 10 by brazing.

Here, as shown in FIG. 4, the ceramic substrate 11 and the circuit layer 12 (copper plate 22) are bonded using a Ag—Cu—Ti-based brazing filler metal 24.

Figure 2:
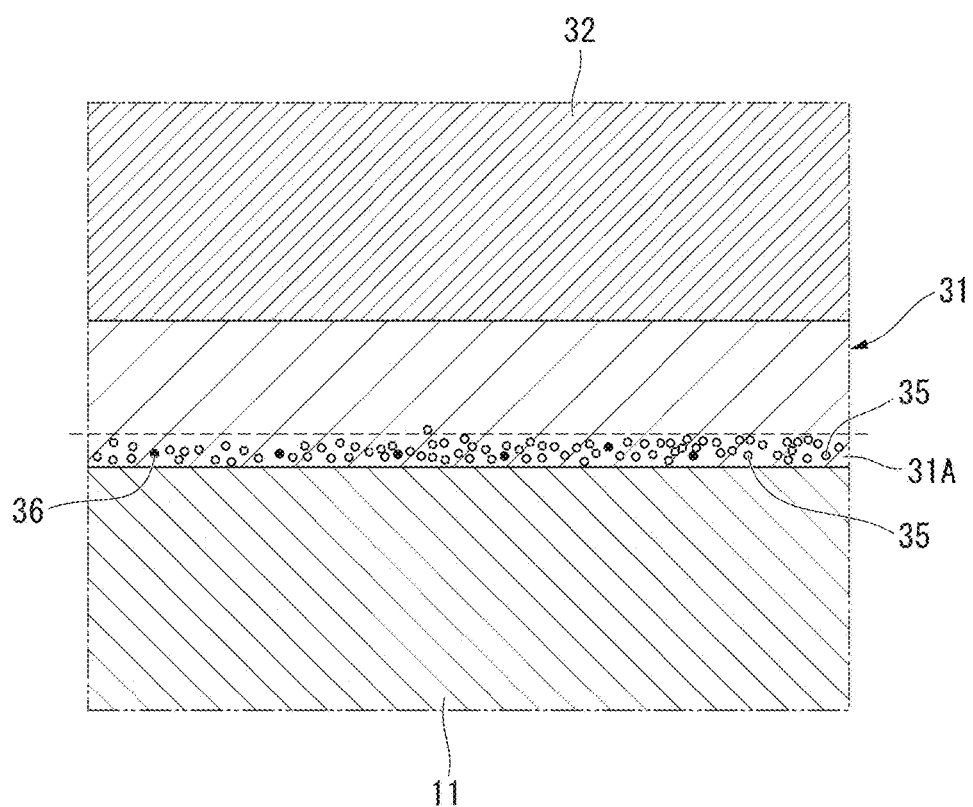
FIG. 2 is a schematic diagram of a bonding interface between a circuit layer (copper member) and a ceramic substrate (ceramic member) in the power module substrate according to the first embodiment of the present invention.

A Ti compound layer 31 made of TiN (titanium nitride) and a Ag—Cu eutectic layer 32 are formed at the bonding interface between the ceramic substrate 11 and the circuit layer 12 (copper plate 22) as shown in FIG. 2. The Cu content of the Ag—Cu—Ti-based brazing filler metal 24 is preferably 18 mass % to 34 mass % and the Ti content is preferably 0.3 mass % to 7 mass %. However, there is no limitation thereto. In addition, in the embodiment, a foil is used as the Ag—Cu—Ti-based brazing filler metal 24 and the thickness may be set to be in a range from 3 μm to 50 μm.

Ag particles 35 are dispersed in the Ti compound layer 31.

A large amount of the Ag particles 35 is distributed in the Ti compound layer 31 on the side close to the ceramic substrate 11, and the concentration of Ag in a near interface region 31A from the interface with the ceramic substrate 11 to 500 nm in the Ti compound layer 31 is 0.3 atomic % or more and preferably set to be in a range from 0.3 atomic % to 15 atomic %. In the embodiment, 90% or more of the Ag particles 35 observed in the Ti compound layer 31 is distributed in the aforementioned near interface region 31A. The ratio of the Ag particles 35 distributed in the aforementioned near interface region 31A is preferably 95% or more and the upper limit is 100%. However, there is no limitation thereto.

In addition, in the embodiment, the particle size of the Ag particles 35 dispersed in the Ti compound layer 31 is set to be in a range from 10 nm to 100 nm. The particle size of the Ag particles 35 may be set to be in a range from 10 nm to 50 nm.

Further, in the embodiment, Cu particles 36 are dispersed in the Ti compound layer 31 other than the Ag particles 35.

Next, a method for manufacturing the power module substrate 10 of the aforementioned embodiment will be described with reference to FIGS. 3 to 5.

Figure 3:
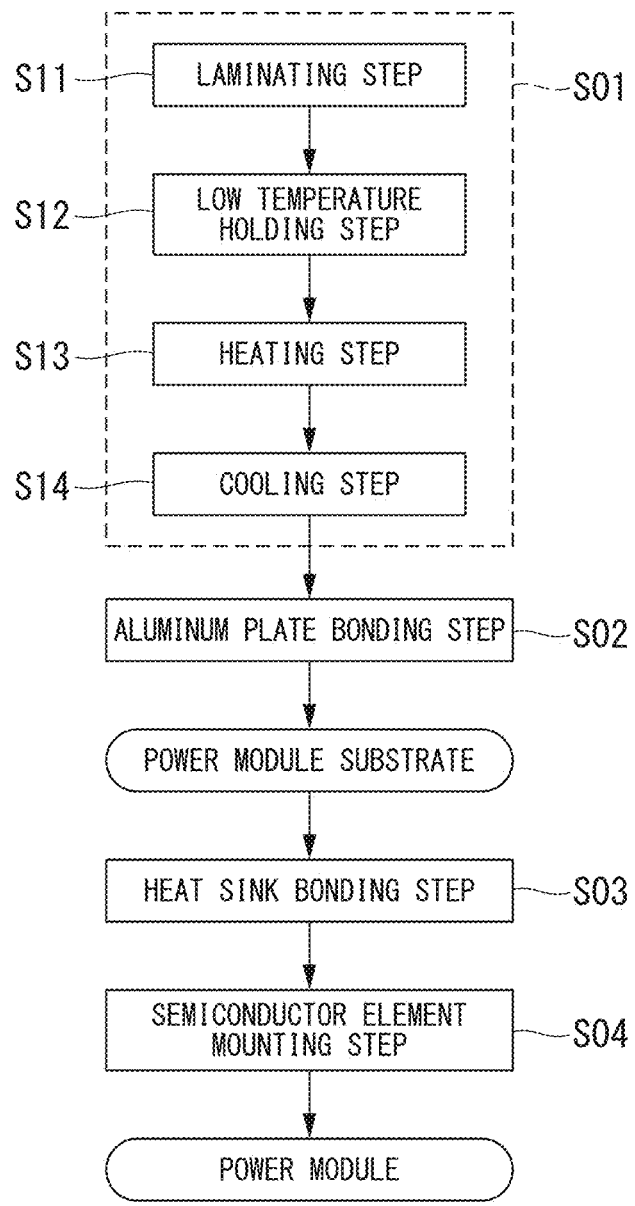
FIG. 3 is a flow chart showing a method for manufacturing the power module substrate according to the first embodiment of the present invention.

As shown in FIGS. 3 and 4, the copper plate 22 which becomes the circuit layer 12 is bonded to the ceramic substrate 11 (copper plate bonding step S01). In the copper plate bonding step S01 of the embodiment, the copper plate 22 made of a rolled sheet of oxygen-free copper and the ceramic substrate 11 made of AlN are bonded by using the Ag—Cu—Ti-based brazing filler metal 24. The copper plate bonding step S01 will be described in detail later.

Next, the aluminum plate 23 which becomes the metal layer 13 is bonded to the other surface of the ceramic substrate 11 (aluminum plate bonding step S02).

In the aluminum plate bonding step S02, the ceramic substrate 11 and the aluminum plate 23 are laminated via a brazing filler metal 25, and the ceramic substrate and the aluminum plate are put into a vacuum furnace and subjected to brazing while being compressed in the lamination direction. Thus, the ceramic substrate 11 and the aluminum plate 23 are bonded. At this time, as the brazing filler metal 25, for example, an Al—Si-based brazing filler metal foil can be used and the brazing temperature is preferably set to 600° C. to 650° C.

Thus, the power module substrate 10 of the embodiment is manufactured.

Next, the heat sink 51 is bonded to the other surface (lower side in FIG. 1) of the metal layer 13 of the power module substrate 10 (heat sink bonding step S03).

In the heat sink bonding step S03, the power module substrate 10 and the heat sink 51 are laminated via a brazing filler metal 26 and this laminated body is put into a vacuum furnace and subjected to brazing while being compressed in the lamination direction. Thus, the metal layer 13 of the power module substrate 10 and the top plate portion 52 of the heat sink 51 are bonded. At this time, as the brazing filler metal 26, for example, an Al—Si-based brazing filler metal foil having a thickness of 20 μm to 110 μm can be used. It is preferable that the brazing temperature be set to a temperature lower than the brazing temperature in the aluminum bonding step S02.

Next, the semiconductor element 3 is bonded to one surface of the circuit layer 12 of the power module substrate 10 by soldering (semiconductor element mounting step S04).

Through the above steps, the power module 1 shown in FIG. 1 is produced.

Here, the copper plate bonding step S01 that is the method for manufacturing the Cu/ceramic bonded body according to the embodiment will be described in detail.

In the copper plate bonding step S01, first, the copper plate 22 which becomes the circuit layer 12 is laminated on one surface of the ceramic substrate 11 via the Ag—Cu—Ti-based brazing filler metal 24 (laminating step S11).

Next, in a state in which the ceramic substrate 11 and the copper plate 22 are compressed in the lamination direction under pressure in a range from 0.5 kgf/cm$^2$ to 35 kgf/cm$^2$ (4.9×10$^4$ Pa to 343×10$^4$ Pa), the ceramic substrate and the copper plate are put into a heating furnace in a vacuum or argon atmosphere and heated and the temperature is held (low temperature holding step S12). Here, the holding temperature in the low temperature holding step S12 is set to be in a range from the eutectic point temperature of Ag and Al to a temperature lower than the eutectic point temperature of Ag and Cu, and specifically set to be in a range from 570° C. to 770° C. In addition, the holding time in the low temperature holding step S12 is set to be in a range from 30 minutes to 5 hours. The holding temperature in the low temperature holding step S12 is preferably set to be in a range from 590° C. to 750° C. Further, the holding time in the low temperature holding step S12 is preferably set to be in a range from 60 minutes to 3 hours.

Figure 5:
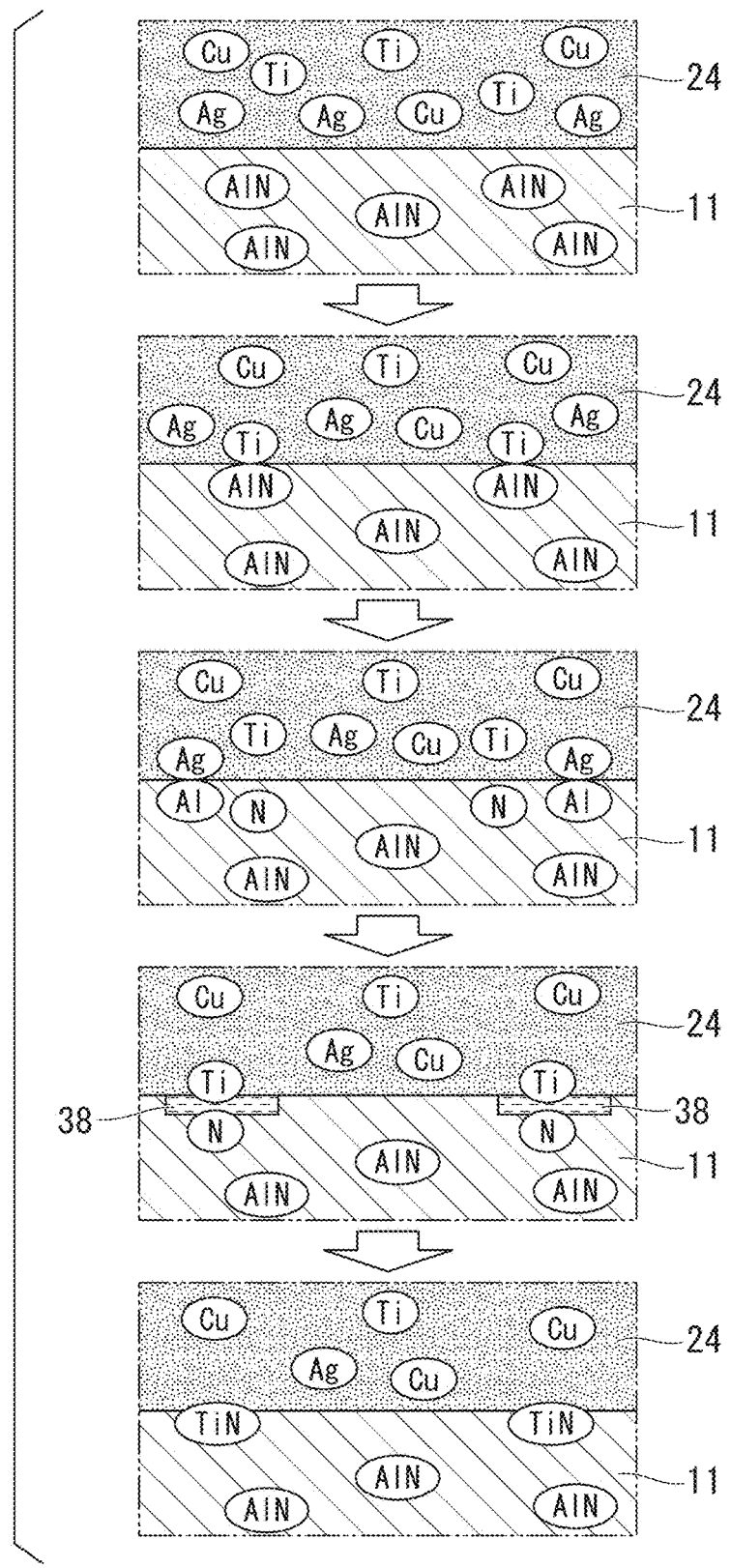
FIG. 5 is a schematic explanatory diagram showing a Ti compound layer forming process in a low temperature holding step.

Since the temperature equal to or higher than the eutectic point temperature of Ag and Al is held in the low temperature holding step S12, as shown in FIG. 5, Ag in the Ag—Cu—Ti-based brazing filler metal 24, and Al formed by the reaction of the ceramic substrate 11 made of AlN with Ti undergo a eutectic reaction to form a liquid phase 38. In the liquid phase 38, Ti in the Ag—Cu—Ti-based brazing filler metal 24 reacts with N (nitrogen) in the ceramic substrate 11 to form TiN. Thus, the Ti compound layer 31 made of TiN is formed in the form of corrosion of the surface of the ceramic substrate 11.

After the low temperature holding step S12, in the state in which the copper plate 22 and the ceramic substrate 11 are compressed, the copper plate and the ceramic substrate are heated in a heating furnace in a vacuum atmosphere to melt the Ag—Cu—Ti-based brazing filler metal 24 (heating step S13). Here, the heating temperature in the heating step S13 is set to the eutectic point temperature of Ag and Cu or higher and specifically is set to be in a range from 790° C. to 830° C. In addition, the holding time in the heating step S13 is set to be in a range from 5 minutes to 60 minutes. The heating temperature in the heating step S13 is preferably set to be in a range from 800° C. to 820° C. Further, the holding time in the heating step S13 is preferably set to be in a range from 10 minutes to 30 minutes.

After the heating step S13, cooling is performed to solidify the melted Ag—Cu—Ti-based brazing filler metal 24 (cooling step S14). The cooling rate in the cooling step S14 is not particularly limited and is preferably set to be in a range from 2° C./min to 10° C./min.

As described above, the copper plate bonding step S01 includes the laminating step S11, the low temperature holding step S12, the heating step S13, and the cooling step S14 and the ceramic substrate 11 which is a ceramic member and the copper plate 22 which is a copper member are bonded.

The Ag particles 35 and the Cu particles 36 are dispersed in the Ti compound layer 31 made of TiN.

According to the Cu/ceramic bonded body (power module substrate 10) having the above configuration of the embodiment, the copper plate 22 (circuit layer 12) made of oxygen-free copper and the ceramic substrate 11 made of AlN are bonded using the Ag—Cu—Ti-based brazing filler metal 24, the Ti compound layer 31 made of TiN is formed at the bonding interface of the ceramic substrate 11, and since the Ag particles 35 and the Cu particles 36 are dispersed in the Ti compound layer 31, the Ti compound layer 31 is sufficiently formed at the time of bonding. As a result, it is possible to obtain the power module substrate 10 in which the copper plate 22 (circuit layer 12) and the ceramic substrate 11 are reliably bonded.

In addition, since the concentration of Ag in the aforementioned near interface region 31A of the Ti compound layer 31 is set to 0.3 atomic % or more in the embodiment, the Ti compound layer 31 is sufficiently formed at the bonding interface of the ceramic substrate 11. As a result, the copper plate 22 (circuit layer 12) and the ceramic substrate 11 are bonded strongly together.

Further, in the embodiment, the Ag particles 35 dispersed in the Ti compound layer 31 have a relatively fine particle size in a range from 10 nm to 100 nm and are assumed to be formed in the process of forming the aforementioned Ti compound layer 31 by the reaction between Ti and N. Thus, the Ti compound layer 31 is sufficiently formed at the interface of the ceramic substrate 11, and thus it is possible to obtain the power module substrate 10 in which the copper plate 22 (circuit layer 12) and the ceramic substrate 11 are reliably bonded.

In addition, in the embodiment, the copper plate bonding step S01 includes the laminating step S11 of laminating the copper plate 22 and the ceramic substrate 11 via the Ag—Cu—Ti-based brazing filler metal 24, the low temperature holding step S12 of holding a temperature in a temperature range from the eutectic point temperature of Ag and Al to a temperature lower than the eutectic point temperature of Ag and Cu in a state in which the laminated copper plate 22 and ceramic substrate 11 are compressed in the lamination direction, the heating step S13 of, after the low temperature holding step S12, performing heating to the eutectic point temperature of Ag and Cu or higher to melt the Ag—Cu—Ti-based brazing filler metal 24, and the cooling step S14 of, after the heating step S13, performing cooling to solidify the melted Ag—Cu—Ti-based brazing filler metal 24. Therefore, the copper plate 22 and the ceramic substrate 11 can be reliably bonded.

That is, in the low temperature holding step S12 of holding the temperature in a temperature range from the eutectic point temperature of Ag and Al to a temperature lower than the eutectic point temperature of Ag and Cu, the liquid phase 38 is formed at the interface between the copper plate 22 and the ceramic substrate 11 by the eutectic reaction between Al and Ag. In the liquid phase 38, Ti reacts with N to form the Ti compound layer 31 at the interface of the ceramic substrate 11. In this process, the Ag particles 35 are dispersed in the Ti compound layer 31. Thus, even when the heating temperature in the heating step S13 is set to a relatively low temperature, the copper plate 22 and the ceramic substrate 11 can be reliably bonded.

Here, in the embodiment, the holding temperature in the low temperature holding step S12 is set to the eutectic point temperature of Ag and Al or higher and specifically set to 570° C. or higher. Therefore, the liquid phase 38 can be reliably formed at the interface between the copper plate 22 and the ceramic substrate 11 by the eutectic reaction between Al and Ag.

In addition, since the holding temperature in the low temperature holding step S12 is set to a temperature lower than the eutectic point temperature of Ag and Cu and is specifically set to be lower than 770° C., Ag which reacts with Al can be secured without consuming Ag by the reaction with Cu. As a result, it is possible to reliably form the liquid phase 38 by the eutectic reaction between Al and Ag.

In the embodiment, since the holding time in the low temperature holding step S12 is set to 30 minutes or more, the Ti compound layer 31 made of TiN is sufficiently formed and even when the heating temperature in the heating step S13 is set to a relatively low temperature, the copper plate 22 and the ceramic substrate 11 can be reliably bonded. In addition, since the holding time in the low temperature holding step S12 is set to 5 hours or less, the amount of energy consumed can be reduced.

Further, in the embodiment, since the heating temperature in the heating step S13 is set to a relatively low temperature in a range from 790° C. to 830° C., the thermal load on the ceramic substrate 11 at the time of bonding can be reduced and deterioration of the ceramic substrate 11 can be limited. Since the copper plate bonding step includes the low temperature holding step S12 as described above, even in the case in which the heating temperature in the heating step S13 is set to a relatively low temperature, the ceramic substrate 11 and the copper plate 22 can be reliably bonded.

(Second Embodiment)

Next, a second embodiment of the present invention will be described with reference to FIGS. 6 to 10.

A Cu/ceramic bonded body according to the embodiment includes a power module substrate 110 formed by bonding a copper plate 122 (circuit layer 112) and a copper plate 123 (metal layer 113) which are copper members to a ceramic substrate 111 which is a ceramic member.

Figure 6:
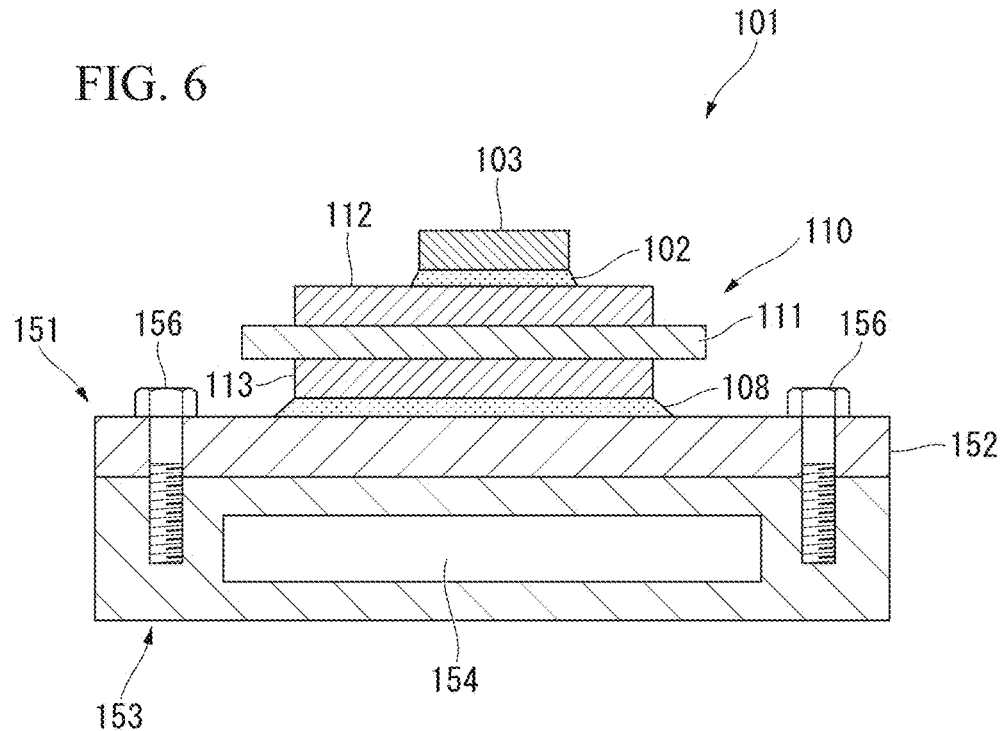
FIG. 6 is a schematic explanatory diagram of a power module using a power module substrate according to a second embodiment of the present invention.

In FIG. 6, the power module substrate 110 according to the second embodiment of the present invention and a power module 101 using the power module substrate 110 are shown.

The power module 101 includes the power module substrate 110, a semiconductor element 103 that is bonded to one side (upper side in FIG. 6) of the power module substrate 110 via a first solder layer 102, and a heat sink 151 that is arranged on the other side (lower side in FIG. 6) of the power module substrate 110.

The power module substrate 110 includes the ceramic substrate 111, the circuit layer 112 that is arranged on one surface (upper surface in FIG. 6) of the ceramic substrate 111, and the metal layer 113 that is arranged on the other surface (lower surface in FIG. 6) of the ceramic substrate 111.

The ceramic substrate 111 prevents electrical connection between the circuit layer 112 and the metal layer 113 and is made of alumina ($Al_2O_3$) having high insulating properties in the embodiment. Here, the thickness of the ceramic substrate 111 is set to be in a range from 0.2 mm to 1.5 mm and is set to 0.635 mm in the embodiment.

Figure 9:
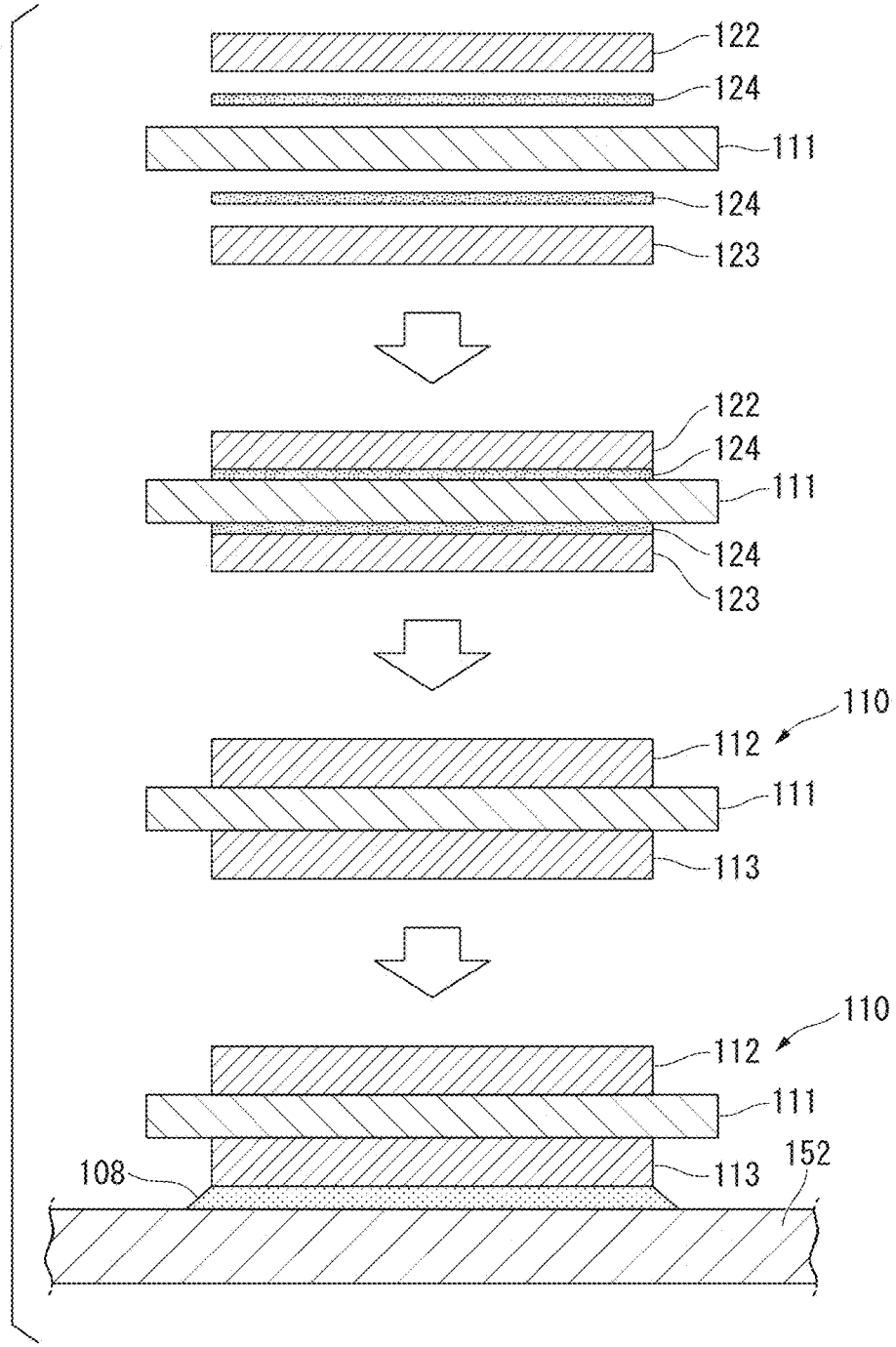
FIG. 9 is an explanatory diagram showing the method for manufacturing the power module substrate according to the second embodiment of the present invention.

As shown in FIG. 9, the circuit layer 112 is formed by bonding the copper plate 122 made of copper or a copper alloy to one surface of the ceramic substrate 111. In the embodiment, as the copper plate 122 constituting the circuit layer 112, a rolled sheet of tough pitch copper is used. A circuit pattern is formed on the circuit layer 112 and one surface (upper surface in FIG. 6) of the circuit layer is a surface on which the semiconductor element 103 is mounted. Here, the thickness of the circuit layer 112 is set to be in a range from 0.1 mm to 1.0 mm and is set to 0.6 mm in the embodiment.

As shown in FIG. 9, the metal layer 113 is formed by bonding the copper plate 123 made of copper or a copper alloy to the other surface of the ceramic substrate 111. In the embodiment, as the copper plate 123 constituting the metal layer 113, a rolled sheet of tough pitch copper is used. Here, the thickness of the metal layer 113 is set to be in a range from 0.1 mm to 1.0 mm and is set to 0.6 mm in the embodiment.

The heat sink 151 cools the aforementioned power module substrate 110 and is configured to have a heat radiation plate 152 which is bonded to the power module substrate 110, and a cooler 153 which is arranged to be laminated on the heat radiation plate 152.

The heat radiation plate 152 causes heat from the aforementioned power module substrate 110 to spread in a plane direction, and is made of copper or a copper alloy having excellent thermal conductivity. The heat radiation plate 152 and the metal layer 113 of the power module substrate 110 are bonded via a second solder layer 108.

As shown in FIG. 6, the cooler 153 includes a channel 154 through which a cooling medium (for example, cooling water) is circulated. The cooler 153 is preferably made of a material having good thermal conductivity and is made of A6063 (an aluminum alloy) in the embodiment.

As shown in FIG. 6, the heat radiation plate 152 is fastened to the cooler 153 by a fixing screw 156 via a grease layer (not shown).

Here, the ceramic substrate 111 and the circuit layer 112 (copper plate 122), and the ceramic substrate 111 and the metal layer 113 (copper plate 123) are bonded using a Ag—Ti-based brazing filler metal 124 as shown in FIG. 9.

Figure 7:
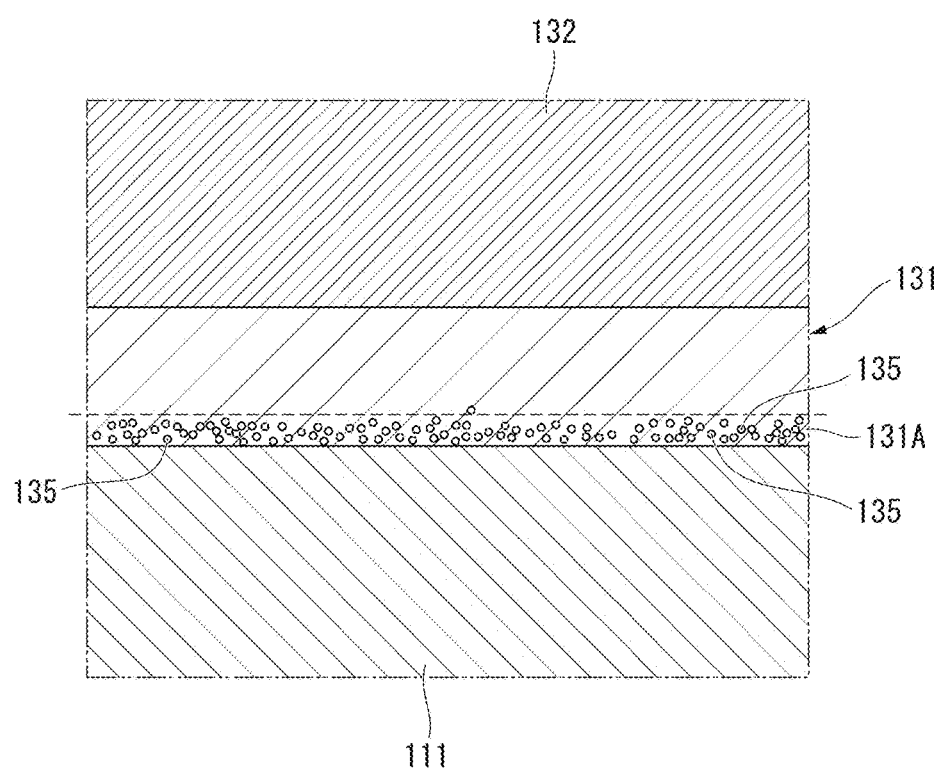
FIG. 7 is a schematic diagram of a bonding interface between a circuit layer (copper member) and a ceramic substrate (ceramic member) in the power module substrate according to the second embodiment of the present invention.

A Ti compound layer 131 made of $TiO_2$ (titanium oxide) and a Ag—Cu eutectic layer 132 are respectively formed at the bonding interface between the ceramic substrate 111 and the circuit layer 112 (copper plate 122) and the bonding interface between the ceramic substrate 111 and the metal layer 113 (copper plate 123) as shown in FIG. 7. The Ti content of the Ag—Ti-based brazing filler metal 124 is preferably 0.4 mass % to 75 mass %. However, there is no limitation thereto. In addition, in the embodiment, as the Ag—Ti-based brazing filler metal 124, a foil is used and the thickness may be set to be in a range from 3 μm to 25 μm.

Ag particles 135 are dispersed in the Ti compound layer 131.

A large amount of the Ag particles 135 is distributed in the Ti compound layer 131 on the side close to the ceramic substrate 111, and the concentration of Ag in a near interface region 131A from the interface with the ceramic substrate 111 to 500 nm in the Ti compound layer 131 is 0.3 atomic % or more and is preferably set to be in a range from 0.3 atomic % to 15 atomic %. In the embodiment, 90% or more of the Ag particles 135 observed in the Ti compound layer 131 is distributed in the aforementioned near interface region 131A. The ratio of the Ag particles 135 distributed in the near interface region 131A is more preferably 95% or more and the upper limit is 100%. However, there is no limitation thereto.

In addition, in the embodiment, the particle size of the Ag particles 135 dispersed in the Ti compound layer 131 is set to be in a range from 10 nm to 100 nm. The particle size of the Ag particles 135 may be set to be in a range from 10 nm to 50 nm.

Next, a method for manufacturing the power module substrate 110 of the aforementioned embodiment will be described with reference to FIGS. 8 to 10.

Figure 8:
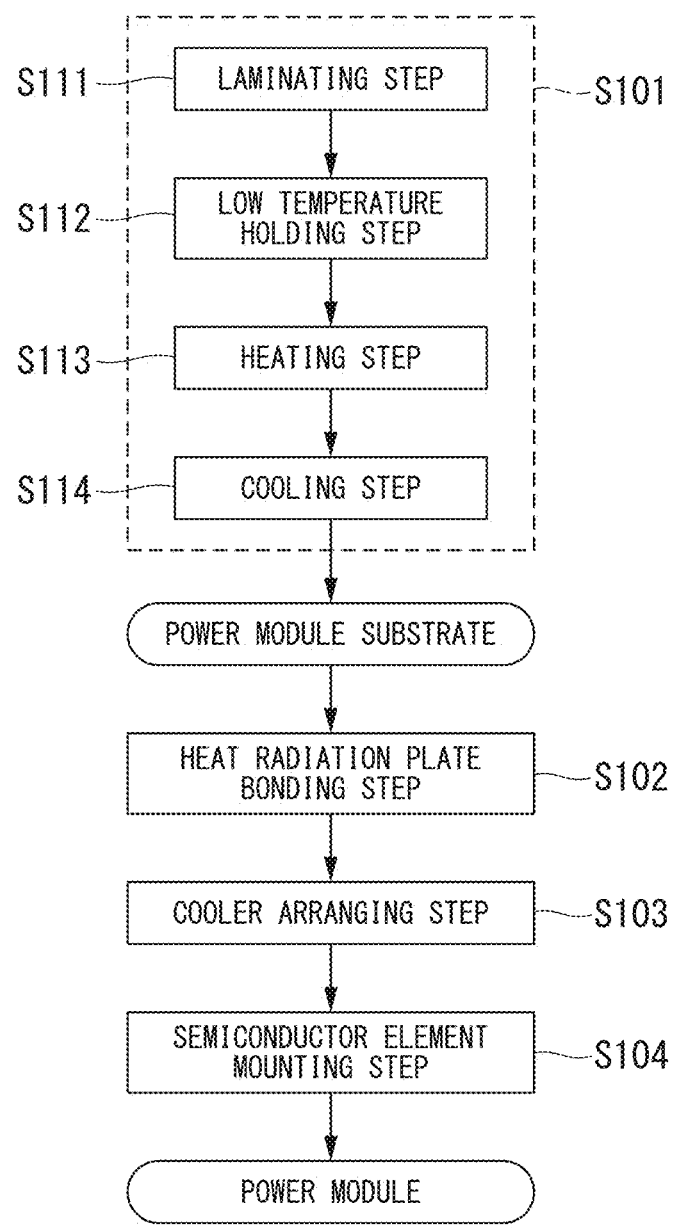
FIG. 8 is a flow chart showing a method for manufacturing the power module substrate according to the second embodiment of the present invention.

As shown in FIGS. 8 and 9, the copper plate 122 which becomes the circuit layer 112 and the ceramic substrate 111, and the copper plate 123 which becomes the metal layer 113 and the ceramic substrate 111 are bonded (copper plate bonding step S101). In the embodiment, the copper plates 122 and 123 made of rolled sheets of tough pitch copper and the ceramic substrate 111 made of $Al_2O_3$ are bonded by the Ag—Ti-based brazing filler metal 124. The copper plate bonding step S101 will be described in detail later.

The power module substrate 110 of the embodiment is manufactured by the copper plate bonding step S101.

Next, the heat radiation plate 152 is bonded to the other surface (lower side in FIG. 6) of the metal layer 113 of the power module substrate 110 (heat radiation plate bonding step S102).

The power module substrate 110 and the heat radiation plate 152 are solder-bonded by laminating the power module substrate 110 and the heat radiation plate 152 via a solder material and putting the substrate and the heat radiation plate into a heating furnace.

Next, the cooler 153 is arranged on the other surface of the heat radiation plate 152 (lower side in FIG. 6) (cooler arranging step S103).

The heat radiation plate 152 and the cooler 153 are coupled by the fixing screw 156 by applying grease (not shown) between the heat radiation plate 152 and the cooler 153.

Next, the semiconductor element 103 is bonded to one surface of the circuit layer 112 of the power module substrate 110 by soldering (semiconductor element mounting step S104).

Through the above steps, the power module 101 shown in FIG. 6 is produced.

Here, the copper plate bonding step S101 which is the method for manufacturing the Cu/ceramic bonded body of the embodiment will be described in detail.

First, in the copper plate bonding step S101, the copper plate 122 which becomes the circuit layer 112 is laminated on the one surface of the ceramic substrate 111 via the Ag—Ti-based brazing filler metal 124 and the copper plate 123 which becomes the metal layer 113 is laminated on the other surface of the ceramic substrate 111 via the Ag—Ti-based brazing filler metal 124 (laminating step S111).

Next, in a state in which the copper plate 122, the ceramic substrate 111, and the copper plate 123 are compressed in the lamination direction under pressure in a range from 0.5 kgf/cm$^2$ to 35 kgf/cm$^2$ (4.9×10$^4$ Pa to 343×10$^4$ Pa), the copper plates and the ceramic substrate are put into a heating furnace in a vacuum or argon atmosphere and heated and the temperature is held (low temperature holding step S112). Here, the holding temperature in the low temperature holding step S112 is set to be in a range from the eutectic point temperature of Ag and Al to a temperature lower than the eutectic point temperature of Ag and Cu and specifically set to be in a range from 570° C. to 770° C. In addition, the holding time in the low temperature holding step S112 is set to be in a range from 30 minutes to 5 hours. The holding temperature in the low temperature holding step S112 is preferably set to be in a range from 590° C. to 750° C. Further, the holding time in the low temperature holding step S112 is preferably set to be in a range from 60 minutes to 3 hours.

Figure 10:
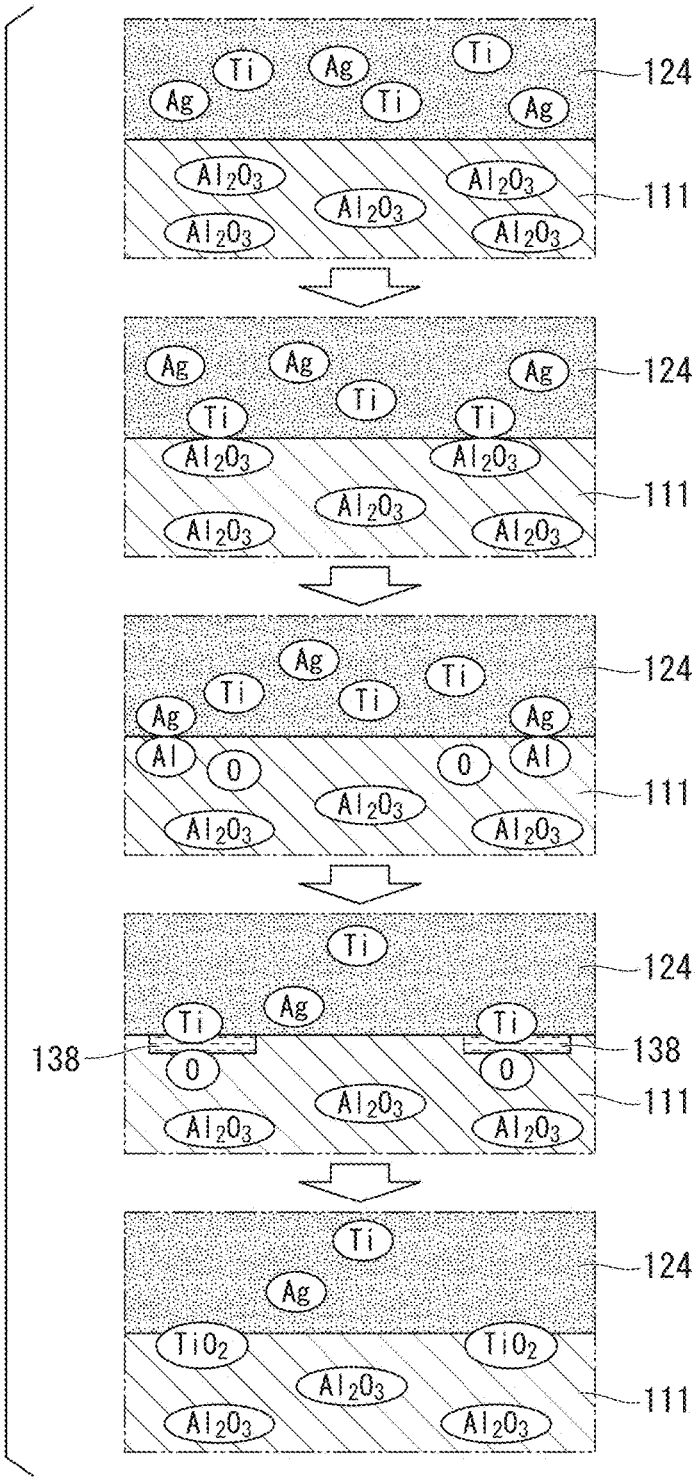
FIG. 10 is a schematic explanatory diagram showing a Ti compound layer forming process in a low temperature holding step.

Since the temperature equal to or higher than the eutectic point temperature of Ag and Al is held in the low temperature holding step S112, as shown in FIG. 10, Ag in the Ag—Ti-based brazing filler metal 124, and Al formed by the reaction of the ceramic substrate 111 made of Al$_2$O$_3$ with Ti undergo a eutectic reaction to form a liquid phase 138. In the liquid phase 138, Ti in the Ag—Ti-based brazing filler metal 124 reacts with O (oxygen) in the ceramic substrate 111 to form TiO$_2$. Thus, the Ti compound layer 131 made of TiO$_2$ is formed in the form of corrosion of the surface of the ceramic substrate 111.

After the low temperature holding step S112, in the state in which the copper plate 122, the ceramic substrate 111, and the copper plate 123 are compressed, the copper plates and the ceramic substrate are heated in the heating furnace in a vacuum atmosphere to melt the Ag—Ti-based brazing filler metal 124 (heating step S113). At this time, Cu is supplied from the copper plates 122 and 123 to the Ag—Ti-based brazing filler metal 124 and the melting point is lowered due to a eutectic reaction between Ag and Cu. Thus, melting of the Ag—Ti-based brazing filler metal 124 is promoted. Here, the heating temperature in the heating step S113 is set to the eutectic point temperature of Ag and Cu or higher and specifically set to be in a range from 790° C. to 830° C. In addition, the holding time in the heating step S113 is set to be in a range from 5 minutes to 60 minutes. The heating temperature in the heating step S113 is preferably set to be in a range from 800° C. to 820° C. Further, the holding time in the heating step S113 is preferably set to be in a range from 10 minutes to 30 minutes.

After the heating step S113, cooling is performed to solidify the melted Ag—Ti-based brazing filler metal 124 (cooling step S114). The cooling rate in the cooling step S114 is not particularly limited and is preferably set to be in a range from 2° C./min to 10° C./min.

As described above, the copper plate bonding step S101 includes the laminating step S111, the low temperature holding step S112, the heating step S113, and the cooling step S114 and the ceramic substrate 111 which is a ceramic member and the copper plates 122 and 123 which are copper members are bonded.

The Ag particles 135 are dispersed in the Ti compound layer 131 made of TiO$_2$.

According to the Cu/ceramic bonded body (power module substrate 110) having the above configuration of the embodiment, the copper plate 122 (circuit layer 112) and the copper plates 123 (metal layer 113) made of tough pitch copper and the ceramic substrate 111 made of Al$_2$O$_3$ are bonded using the Ag—Ti-based brazing filler metal 124, and the Ti compound layer 131 made of TiO$_2$ is formed at the bonding interface of the ceramic substrate 111. Since the Ag particles 135 are dispersed in the Ti compound layer 131, the Ti compound layer 131 is sufficiently formed at the time of bonding. As a result, it is possible to obtain the power module substrate 110 in which the copper plate 122 (circuit layer 112), the copper plate 123 (metal layer 113), and the ceramic substrate 111 are reliably bonded.

In addition, in the embodiment, the copper plate bonding step S101 includes the laminating step S111 of laminating the copper plates 122 and 123 and the ceramic substrate 111 via the Ag—Ti-based brazing filler metal 124, the low temperature holding step S112 of holding a temperature in a temperature range from the eutectic point temperature of Ag and Al to a temperature lower than the eutectic point temperature of Ag and Cu in a state in which the laminated copper plates 122 and 123 and ceramic substrate 111 are compressed in the lamination direction, the heating step S113 of, after the low temperature holding step S112, performing heating to the eutectic point temperature of Ag and Cu or higher to melt the Ag—Ti-based brazing filler metal 124, and the cooling step S114 of, after the heating step S113, performing cooling to solidify the melted Ag—Ti-based brazing filler metal 124. As a result, the copper plates 122 and 123, and the ceramic substrate 111 can be reliably bonded.

That is, in the low temperature holding step S112, the liquid phase 138 is formed at each interface between the copper plates 122 and 123, and the ceramic substrate 111 by the eutectic reaction between Al and Ag, and the Ti compound layer 131 is formed at the interface with the ceramic substrate 111 in the liquid phase 138 by a reaction between Ti and O. In the process, the Ag particles 135 are dispersed in the Ti compound layer 131. Thus, even in the case in which the heating temperature in the heating step S113 is set to a relatively low temperature, the copper plates 122 and 123, and the ceramic substrate 111 can be reliably bonded.

Here, since the heating temperature in the heating step S113 is set to a relatively low temperature in a range from 790° C. to 830° C. in the embodiment, the thermal load on the ceramic substrate 111 at the time of bonding can be reduced and deterioration of the ceramic substrate 111 can be limited. Since the copper plate bonding step includes the low temperature holding step S112 as described above, even in the case in which the heating temperature in the heating step S113 is set to a relatively low temperature, the ceramic substrate 111 and the copper plates 122 and 123 can be reliably bonded.

(Third Embodiment)

Next, a third embodiment of the present invention will be described with reference to FIGS. 11 to 15.

Figure 11:
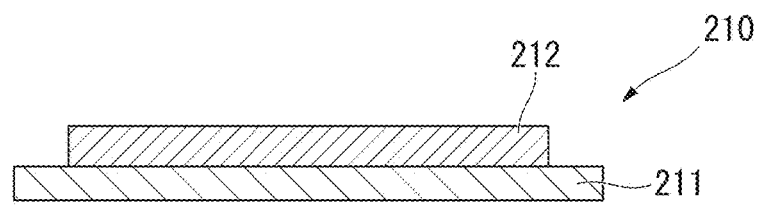
FIG. 11 is a schematic explanatory diagram of a power module substrate according to a third embodiment of the present invention.

A Cu/ceramic bonded body according to this embodiment includes a power module substrate 210 formed by bonding a copper plate 222 (circuit layer 212) which is a copper member to a ceramic substrate 211 which is a ceramic member as shown in FIG. 11.

The ceramic substrate 211 is made of Al$_2$O$_3$ (alumina) having high insulating properties and has the same configuration as that of the second embodiment.

Figure 14:
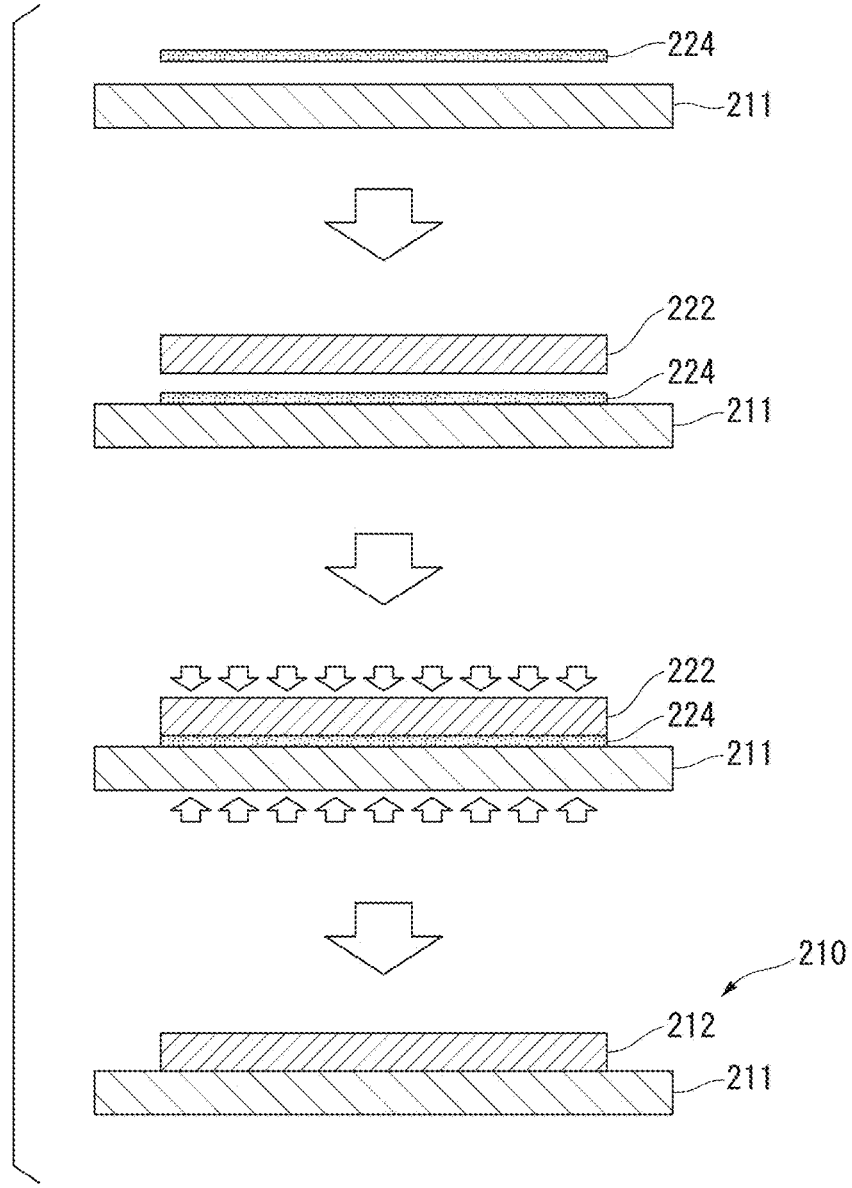
FIG. 14 is an explanatory diagram showing the method for manufacturing the power module substrate according to the third embodiment of the present invention.

The circuit layer 212 is formed by bonding a copper plate 222 made of copper or a copper plate to one surface of the ceramic substrate 211 as shown in FIG. 14 and has the same configuration as that of the second embodiment.

Here, the ceramic substrate 211 and the circuit layer 212 (copper plate 222) are bonded using a Ag—Ti-based brazing filler metal paste 224 as shown in FIG. 14.

Figure 12:
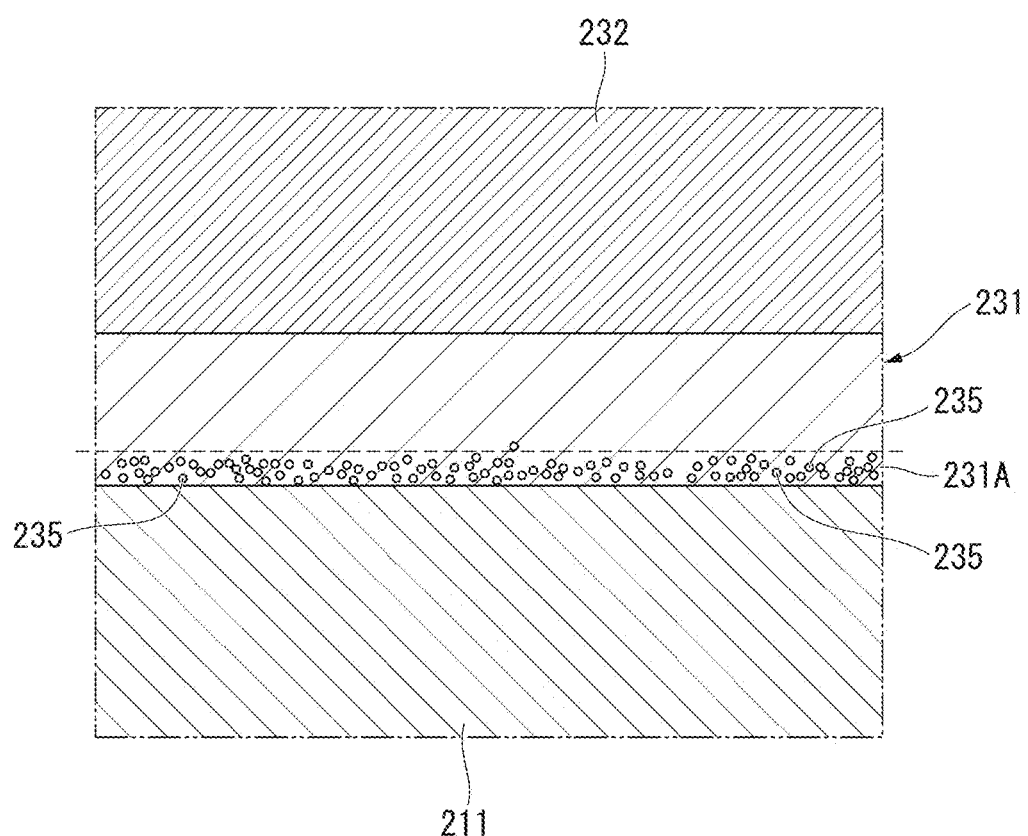
FIG. 12 is a schematic diagram of a bonding interface between a circuit layer (copper member) and a ceramic substrate (ceramic member) in the power module substrate according to the third embodiment of the present invention.

A Ti compound layer 231 made of TiO$_2$ (titanium oxide) and a Ag—Cu eutectic layer 232 are formed at the bonding interface between the ceramic substrate 211 and the circuit layer 212 (copper plate 222) as shown in FIG. 12.

Then, Ag particles 235 are dispersed in the Ti compound layer 231.

A large amount of the Ag particles 235 is distributed in the Ti compound layer 231 on the side close to the ceramic substrate 211 and the concentration of Ag in a near interface region 231A from the interface with the ceramic substrate 211 to 500 nm in the Ti compound layer 231 is set to 0.3 atomic % or more and preferably set to be in a range from 0.3 atomic % to 15 atomic %. In the embodiment, 90% or more of the Ag particles 235 observed in the Ti compound layer 231 is distributed in the aforementioned near interface region 231A. The ratio of the Ag particles 235 distributed in the near interface region 231A is more preferably 95% or more and the upper limit is 100%. However, there is no limitation thereto.

In addition, in the embodiment, the particles size of the Ag particles 235 dispersed in the Ti compound layer 231 is set to be in a range from 10 nm to 100 nm. The particle size of the Ag particles 235 may be set to be in a range from 10 nm to 50 nm.

Figure 13:
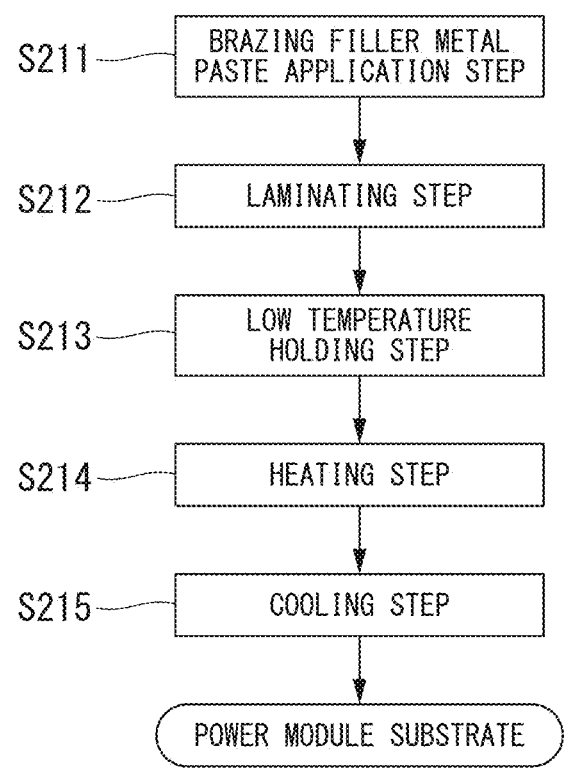
FIG. 13 is a flow chart showing a method for manufacturing the power module substrate according to the third embodiment of the present invention.

Next, a method for manufacturing the power module substrate 210 of the aforementioned embodiment will be described with reference to FIGS. 13 to 15.

First, the Ag—Ti-based brazing filler metal paste 224 is applied to one surface of the ceramic substrate 211 by screen printing (brazing filler metal paste application step S211). The thickness of the Ag—Ti-based brazing filler metal paste 224 is set to 20 μm to 300 μm after drying.

Here, the Ag—Ti-based brazing filler metal paste 224 includes a powder component containing Ag and Ti, a resin, a solvent, a dispersing agent, a plasticizer, and a reducing agent.

In the embodiment, the content of the powder component is set to 40 mass % to 90 mass % with respect to the total amount of the Ag—Ti-based brazing filler metal paste 224. In addition, in the embodiment, the viscosity of the Ag—Ti-based brazing filler metal paste 224 is adjusted to 10 Pa·s to 500 Pa·s and more preferably to 50 Pa·s to 300 Pa·s.

As the composition of the powder component, the Ti content is 0.4 mass % to 75 mass % and the balance is Ag and inevitable impurities. In the embodiment, the powder component includes 10 mass % of Ti and the balance being Ag and inevitable impurities.

Further, in the embodiment, as the powder component containing Ag and Ti, an alloy powder of Ag and Ti is used. The alloy powder is prepared by an atomizing method and the prepared alloy powder is sieved. Thus, the particle size is set to 40 μm or less, preferably set to 20 μm or less, and still more preferably set to 10 μm or less.

Next, the copper plate 222 which becomes the circuit layer 212 is laminated on one surface of the ceramic substrate 211 (laminating step S212).

Further, in a state in which the copper plate 222 and the ceramic substrate 211 are compressed in the lamination direction under pressure in a range from 0.5 kgf/cm$^2$ to 35 kgf/cm$^2$ (4.9×10$^4$ Pa to 343×10$^4$ Pa), the copper plate and the ceramic substrate are put into a heating furnace in a vacuum or argon atmosphere and heated, and the temperature is held (low temperature holding step S213). Here, the holding temperature in the low temperature holding step S213 is set to be in a range from the eutectic point temperature of Ag and Al to a temperature lower than the eutectic point temperature of Ag and Cu and specifically set to be in a range from 570° C. to 770° C. In addition, the holding time in the low temperature holding step S213 is set to be in a range from 30 minutes to 5 hours. The holding temperature in the low temperature holding step S213 is preferably set to be in a range from 590° C. to 750° C. Further, the holding time in the low temperature holding step S213 is preferably set to be from 60 minutes to 3 hours.

Figure 15:
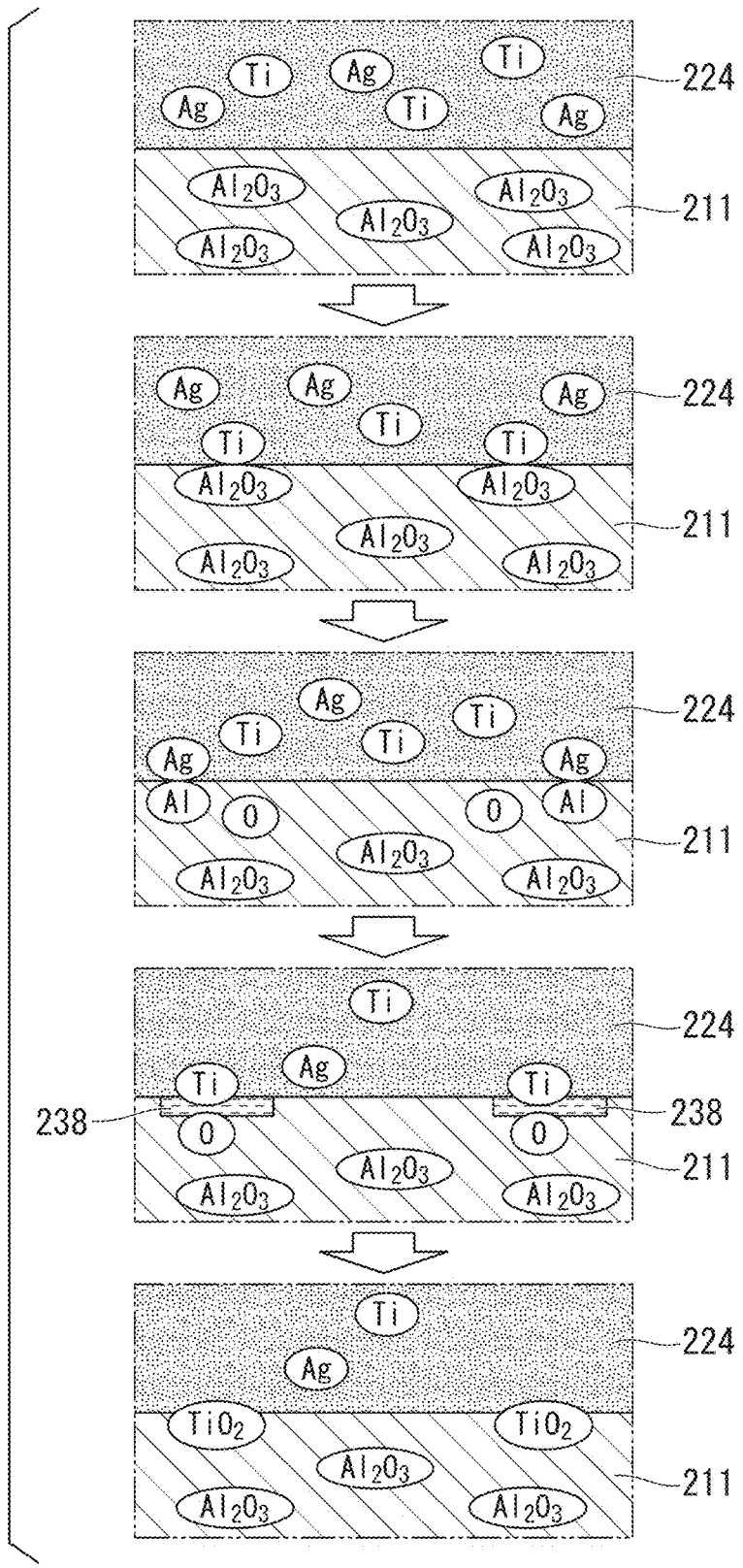
FIG. 15 is a schematic explanatory diagram showing a Ti compound layer forming process in a low temperature holding step.

Since the temperature equal to or higher than the eutectic point temperature of Ag and Al is held in the low temperature holding step S213, as shown in FIG. 15, Ag in the Ag—Ti-based brazing filler metal paste 224, and Al formed by the reaction of the ceramic substrate 211 made of Al$_2$O$_3$ with Ti undergo a eutectic reaction to form a liquid phase 238. In the liquid phase 238, Ti in the Ag—Ti-based brazing filler metal paste 224 reacts with O (oxygen) in the ceramic substrate 211 to form TiO$_2$. Thus, the Ti compound layer 231 made of TiO$_2$ is formed in the form of corrosion of the surface of the ceramic substrate 211.

After the low temperature holding step S213, in the state in which the copper plate 222 and the ceramic substrate 211 are compressed, the copper plate and the ceramic substrate are heated in the heating furnace in a vacuum atmosphere to melt the Ag—Ti-based brazing filler metal paste 224 (heating step S214). At this time, Cu is supplied from the copper plate 222 to the Ag—Ti-based brazing filler metal paste 224 and the melting point is lowered due to a eutectic reaction between Ag and Cu. Thus, melting of the Ag—Ti-based brazing filler metal paste 224 is promoted. Here, the heating temperature in the heating step S214 is set to the eutectic point temperature of Ag and Cu or higher and specifically set to be in a range from 790° C. to 830° C. In addition, the holding time in the heating step S214 is set to be in a range from 5 minutes to 60 minutes. The heating temperature in the heating step S214 is preferably set to be in a range from 800° C. to 820° C. Further, the holding time in the heating step S214 is preferably set to be 10 minutes to 30 minutes.

After the heating step S214, cooling is performed to solidify the melted Ag—Ti-based brazing filler metal paste 224 (cooling step S215). The cooling rate in the cooling step S215 is not particularly limited and is preferably set to be from 2° C./min to 10° C./min.

As described above, the power module substrate 210 of the embodiment is manufactured by bonding the copper plate 222 which is a copper member and the ceramic substrate 211 which is a ceramic member.

The Ag particles 235 are dispersed in the Ti compound layer 231 made of TiO$_2$.

The Cu/ceramic bonded body (power module substrate 210) having the above configuration of the embodiment exhibits the same effect as that of the second embodiment.

In addition, in the embodiment, the method includes the brazing filler metal paste application step S211 of applying the Ag—Ti-based brazing filler metal paste 224 to one surface of the ceramic substrate 211, the laminating step S212 of laminating the copper plate 222 and the ceramic substrate 211 via the applied Ag—Ti-based brazing filler metal paste 224, the low temperature holding step S213 of holding a temperature in a temperature range from the eutectic point temperature of Ag and Al to a temperature lower than the eutectic point temperature of Ag and Cu in a state in which the laminated copper plate 222 and ceramic substrate 211 are compressed in the lamination direction, the heating step S214 of, after the low temperature holding step S213, performing heating to the eutectic point temperature of Ag and Cu or higher to melt the Ag—Ti-based brazing filler metal paste 224, and the cooling step S215 of, after the heating step S214, performing cooling to solidify the melted Ag—Ti-based brazing filler metal paste 224. As a result, the copper plate 222 and the ceramic substrate 211 can be reliably bonded.

That is, in the low temperature holding step S213, the liquid phase 238 is formed at the interface between the copper plate 222 and the ceramic substrate 211 by the eutectic reaction between Al and Ag and in the liquid phase 238, Ti reacts with O to form the Ti compound layer 231 at the interface of the ceramic substrate 211. In the process, the Ag particles 235 are dispersed in the Ti compound layer 231. Thus, even in the case in which the heating temperature in the heating step S214 is set to a relatively low temperature, the copper plate 222 and the ceramic substrate 211 can be reliably bonded.

Here, in the embodiment, since the heating temperature in the heating step S214 is set to a relatively low temperature in a range from 790° C. to 830° C., thermal load on the ceramic substrate 211 at the time of bonding can be reduced and deterioration of the ceramic substrate 211 can be limited. In addition, as described above, the method includes the low temperature holding step S213, even in the case in which the heating temperature in the heating step S214 is a relatively low temperature, the ceramic substrate 211 and the copper plate 222 can be reliably bonded.

While embodiments of the present invention have been described above, the present invention is not limited to these embodiments and modifications can be appropriately made without departing from the technical ideas of the invention.

For example, the copper plate constituting the circuit layer or the metal layer using a rolled sheet of oxygen-free copper or tough pitch copper is described. However, the embodiments are not limited thereto and sheets made of other types of copper or other copper alloys may be used.

In addition, in the first embodiment, the aluminum plate constituting the metal layer using a rolled sheet of pure aluminum having a purity of 99.99 mass % is described. However, the embodiment is not limited thereto and sheets made of other types of aluminum such as aluminum having a purity of 99 mass % (2N aluminum), or other aluminum alloys may be used.

Furthermore, in the embodiment, the concentration of Ag in the near interface region is set to 0.3 atomic % or more. However, the embodiment is not limited thereto.

In addition, in the embodiment, the particle size of the Ag particles dispersed in the Ti compound layer is set to be in a range from 10 nm to 100 nm. However, Ag particles having particle sizes out of the above range may be dispersed.

Furthermore, the heat sink or the heat radiation plate is not limited to the examples of the embodiment and the structure of the heat sink is not particularly limited.

In addition, a buffer layer made of aluminum, an aluminum alloy, or a composite material including aluminum (for example, AlSiC) may be provided between the top plate portion of the heat sink or the heat radiation plate and the metal layer.

Furthermore, in the third embodiment, the ceramic substrate and the copper plate are bonded using the Ag—Ti-based brazing filler metal paste. However, the embodiment is not limited thereto and a Ag—Cu—Ti-based paste may be used. In this case, the third embodiment has the same interface structure as that of the first embodiment.

In addition, the Ag—Ti-based brazing filler metal paste is applied to the ceramic substrate. However, the embodiment is not limited thereto and the Ag—Ti-based brazing filler metal paste or the like may be applied to the copper plate.

Furthermore, the Ag—Ti-based brazing filler metal paste is applied by screen printing but the application method is not limited.

In addition, before the laminating step (S212), a step of drying the Ag—Ti-based brazing filler metal paste may be provided.

Further, in the third embodiment, as the powder component containing Ag and Ti, the alloy powder of Ag and Ti is used. However, the embodiment is not limited thereto and a mixed powder of a Ag powder and a Ti powder can be used. In this case, the particle size of the Ag powder to be used may be 40 μm or less, preferably 20 μm or less, and still more preferably 10 μm or less.

In addition, instead of using the Ti powder, a $TiH_2$ powder can be used. In the case of using the $TiH_2$ powder, as the composition of the powder component, the $TiH_2$ content may be 0.4 mass % to 50 mass % and the balance may be Ag and inevitable impurities. The particle size of the $TiH_2$ powder to be used may be preferably 15 μm or less and more preferably 5 μm or less. Further, in the case of a paste using the $TiH_2$ powder, the thickness of the applied paste may be 20 μm to 300 μm after drying.

In addition, a paste made of a mixed powder of a Ag powder, a Cu powder, and a Ti powder, or a $TiH_2$ powder can be used.

In addition, one or two or more elements selected from In, Sn, Al, Mn and Zn can be added to the Ag—Cu—Ti-based brazing filler metal and the Ag—Ti-based brazing filler metal described in the embodiments. In this case, the bonding temperature can be further lowered.

Further, as the Ag—Ti-based brazing filler metal paste, a paste including Ti, one or two or more elements selected from In, Sn, Al, Mn and Zn, and the balance being Ag and inevitable impurities can be used. In this case, the bonding temperature can be further lowered.

In addition, in the second embodiment, instead of using the foil of the Ag—Ti-based brazing filler metal, the Ag—Ti-based brazing filler metal paste described in the third embodiment can be used.

EXAMPLES

Hereinafter, the results of a confirmation test performed to check the effectiveness of the embodiments according to the present invention will be described.

Cu/ceramic bonded bodys were formed by using ceramic substrates, brazing filler metals, and copper plates shown in Table 1. Specifically, each Cu/ceramic bonded body was formed by bonding a copper plate having a size of 38 mm square and a thickness of 0.6 mm to one surface of a ceramic substrate having a size of 40 mm square and a thickness of 0.635 mm using a brazing filler metal foil containing Ag and Ti and having a thickness of 20 μm under the conditions shown in Table 1. In addition, as the brazing filler metal, in the case of Ag—Cu—Ti, a Ag-28 mass % Cu-3 mass % Ti brazing filler metal was used, and in the case of Ag—Ti, a Ag-10 mass % Ti brazing filler metal was used. The applied pressure (load) in the lamination direction was set to 1.5 kgf/cm$^2$.

In addition, Cu/ceramic bonded bodies were formed by using ceramic substrates, brazing filler metals, and copper plates shown in Table 2. Specifically, each Cu/ceramic bonded body was formed by bonding a copper plate having a size of 38 mm square and a thickness of 0.6 mm to one surface of a ceramic substrate having a size of 40 mm square and a thickness of 0.635 mm using a brazing filler metal paste containing Ag and Ti under the conditions shown in Table 2. The applied pressure (load) in the lamination direction was set to 1.5 kgf/cm$^2$.

As the brazing filler metal paste, in the case of Ag—Cu—Ti, a paste containing a brazing filler metal powder including, a powder component (having a particle size of 20 μm) having a composition of Ag-28 mass % Cu-3 mass % Ti, an acrylic resin, and texanol was used and the thickness of the applied paste was set to the values shown in Table 2.

In the case of Ag—Ti, a paste containing a brazing filler metal powder including a powder component (having a particle size of 20 μm) having a composition of Ag-10 mass % Ti, an acrylic resin, and texanol was used and the thickness of the applied paste was set to the values shown in Table 2.

In the case of Ag—TiH$_2$, a paste containing a mixed powder of a Ag powder (having a particle size of 5 μm) and a TiH$_2$ powder (having a particle size of 5 μm), an acrylic resin, and texanol was used. As the composition of the mixed powder, the TiH$_2$ content was 20 mass % and the balance was Ag and inevitable impurities. The thickness of the applied paste was set to the values shown in Table 2.

In the case of Ag—Cu—TiH$_2$, a paste containing a mixed powder of a Ag powder (having a particle size of 5 μm), a Cu powder (having a particle size of 2.5 μm), and a TiH$_2$ powder (having a particle size of 5 μm), an acrylic resin, and texanol was used. As the composition of the mixed powder, the Cu content was 27 mass %, the TiH$_2$ content was 3 mass %, and the balance was Ag and inevitable impurities. The thickness of the applied paste was set to the values shown in Table 2.

In Examples, after the paste was applied, the paste was dried at 150° C. The coating thickness shown in Table 2 was set to a value after drying.

In each Cu/ceramic bonded body obtained in the above-described manner, the presence of Ag particles and Cu particles in the Ti compound layer, the concentration of Ag in the near interface region in the Ti compound layer, and the bonding rate of the copper plate and the ceramic substrate were evaluated.

(Presence of Ag Particles and Cu Particles in Ti Compound Layer)

5 visual fields of the bonding interface between the copper plate and the ceramic substrate were observed using a scanning electron microscope (ULTRA 55 manufactured by Carl Zeiss NTS GmbH) at a magnitude of 15,000 times (measurement range: 6 μm×8 μm) and the presence of Ag particles and Cu particles in the Ti compound layer was confirmed.

(Concentration of Ag in Near Interface Region in Ti Compound Layer)

A line analysis was performed on the bonding interface between the copper plate and the ceramic substrate (the section parallel to the lamination direction) using an energy dispersive X-ray detector (SDD detector manufactured by Thermo Fisher Scientific Inc. and Norton System Six) and the concentration of Ag in the near interface region in the Ti compound layer was measured.

(Bonding Rate)

The bonding rate of the copper plate and the ceramic substrate was obtained by the following expression using an ultrasonic flow detector (Fine SAT 200 manufactured by Hitachi Power Solutions Co., Ltd.). Here, the initial bonding area was the area of the copper plate (38 mm square) which is an area to be bonded before bonding. In an image obtained by performing a binarization treatment on an ultrasonic flaw image, peeling was indicated by white parts in the bonding portion and thus the area of the white parts was set to a peeled area.

(Bonding Rate)={(Initial bonding area)−(Peeled area)}/(Initial bonding area)×100

Figure 16:
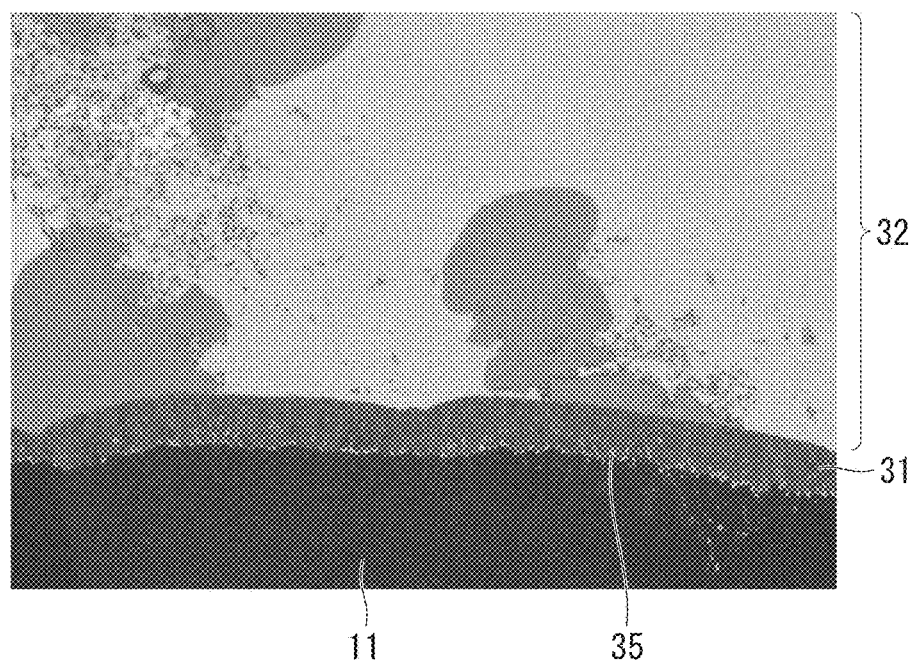
FIG. 16 is a backscattered electron image of a section of a Cu/ceramic bonded body of Example 1.

The evaluation results are show in Tables 3 and 4. In addition, the backscattered electron image of Example 1 is shown in FIG. 16.

TABLE 1

| | Ceramic substrate | Copper plate | Brazing filler metal | Low temperature holding step | | Heating Step | |
|---|---|---|---|---|---|---|---|
| | | | | Temperature [° C.] | Time [minute] | Temperature [° C.] | Time [minute] |
| Example 1 | AlN | TPC | Ag—Ti | 570 | 90 | 810 | 20 |
| Example 2 | AlN | OFC | Ag—Cu—Ti | 590 | 90 | 810 | 20 |
| Example 3 | AlN | OFC | Ag—Cu—Ti | 750 | 90 | 810 | 20 |
| Example 4 | AlN | OFC | Ag—Cu—Ti | 770 | 90 | 810 | 20 |
| Example 5 | AlN | OFC | Ag—Cu—Ti | 630 | 30 | 810 | 10 |
| Example 6 | AlN | OFC | Ag—Cu—Ti | 630 | 60 | 810 | 10 |
| Example 7 | AlN | OFC | Ag—Cu—Ti | 630 | 180 | 810 | 10 |
| Example 8 | AlN | OFC | Ag—Ti | 630 | 300 | 810 | 10 |
| Example 9 | Al$_2$O$_3$ | OFC | Ag—Ti | 720 | 75 | 790 | 30 |
| Example 10 | Al$_2$O$_3$ | OFC | Ag—Ti | 720 | 75 | 800 | 30 |
| Example 11 | Al$_2$O$_3$ | OFC | Ag—Cu—Ti | 720 | 75 | 820 | 30 |
| Example 12 | Al$_2$O$_3$ | OFC | Ag—Cu—Ti | 720 | 75 | 830 | 30 |
| Example 13 | Al$_2$O$_3$ | OFC | Ag—Ti | 600 | 150 | 820 | 5 |
| Example 14 | Al$_2$O$_3$ | OFC | Ag—Ti | 600 | 150 | 820 | 10 |
| Example 15 | Al$_2$O$_3$ | OFC | Ag—Ti | 600 | 150 | 820 | 30 |
| Example 16 | Al$_2$O$_3$ | OFC | Ag—Ti | 600 | 150 | 820 | 60 |
| Conventional Example 1 | AlN | OFC | Ag—Cu—Ti | — | — | 810 | 10 |

TABLE 2

| | Ceramic substrate | Copper plate | Brazing filler metal | Coating thickness (μm) | Low temperature holding step Temperature [° C.] | Low temperature holding step Time [minute] | Heating step Temperature [° C.] | Heating step Time [minute] |
|---|---|---|---|---|---|---|---|---|
| Example 21 | AlN | TPC | Ag—Ti | 50 | 570 | 90 | 810 | 20 |
| Example 22 | AlN | OFC | Ag—Cu—Ti | 50 | 590 | 90 | 810 | 20 |
| Example 23 | AlN | OFC | Ag—Cu—Ti | 80 | 750 | 90 | 810 | 20 |
| Example 24 | AlN | OFC | Ag—Cu—Ti | 70 | 770 | 90 | 810 | 20 |
| Example 25 | AlN | OFC | Ag—Cu—Ti | 60 | 630 | 30 | 810 | 10 |
| Example 26 | AlN | OFC | Ag—Cu—Ti | 70 | 630 | 60 | 810 | 10 |
| Example 27 | AlN | OFC | Ag—Cu—Ti | 60 | 630 | 180 | 810 | 10 |
| Example 28 | AlN | OFC | Ag—Ti | 80 | 630 | 300 | 810 | 10 |
| Example 29 | AlN | OFC | Ag—TiH$_2$ | 50 | 630 | 300 | 810 | 10 |
| Example 30 | AlN | OFC | Ag—Cu—TiH$_2$ | 50 | 630 | 60 | 810 | 10 |
| Example 31 | Al$_2$O$_3$ | OFC | Ag—Ti | 50 | 720 | 75 | 790 | 30 |
| Example 32 | Al$_2$O$_3$ | OFC | Ag—Ti | 50 | 720 | 75 | 800 | 30 |
| Example 33 | Al$_2$O$_3$ | OFC | Ag—Cu—Ti | 50 | 720 | 75 | 820 | 30 |
| Example 34 | Al$_2$O$_3$ | OFC | Ag—Cu—Ti | 80 | 720 | 75 | 830 | 30 |
| Example 35 | Al$_2$O$_3$ | OFC | Ag—Ti | 60 | 600 | 150 | 820 | 5 |
| Example 36 | Al$_2$O$_3$ | OFC | Ag—Ti | 80 | 600 | 150 | 820 | 10 |
| Example 37 | Al$_2$O$_3$ | OFC | Ag—Ti | 80 | 600 | 150 | 820 | 30 |
| Example 38 | Al$_2$O$_3$ | OFC | Ag—Ti | 60 | 600 | 150 | 820 | 60 |
| Example 39 | Al$_2$O$_3$ | OFC | Ag—TiH$_2$ | 50 | 600 | 150 | 820 | 60 |
| Example 40 | Al$_2$O$_3$ | OFC | Ag—Cu—TiH$_2$ | 50 | 720 | 75 | 800 | 30 |
| Conventional Example 2 | AlN | OFC | Ag—Cu—Ti | 80 | — | — | 810 | 10 |

TABLE 3

| | Interface observation result Ti compound layer | Interface observation result Ag particles | Interface observation result Cu particles | Concentration of Ag in near interface region [at %] | Bonding rate [%] |
|---|---|---|---|---|---|
| Example 1 | TiN | Presence | Absence | 0.13 | 93.3 |
| Example 2 | TiN | Presence | Presence | 0.39 | 96.9 |
| Example 3 | TiN | Presence | Presence | 7.68 | 97.2 |
| Example 4 | TiN | Presence | Presence | 12.28 | 97.6 |
| Example 5 | TiN | Presence | Presence | 0.15 | 92.1 |
| Example 6 | TiN | Presence | Presence | 1.02 | 97.2 |
| Example 7 | TiN | Presence | Presence | 5.45 | 97.6 |
| Example 8 | TiN | Presence | Presence | 10.56 | 98.0 |
| Example 9 | TiO$_2$ | Presence | Absence | 0.24 | 91.1 |
| Example 10 | TiO$_2$ | Presence | Absence | 3.66 | 97.1 |
| Example 11 | TiO$_2$ | Presence | Presence | 9.08 | 97.5 |
| Example 12 | TiO$_2$ | Presence | Presence | 11.36 | 98.7 |
| Example 13 | TiO$_2$ | Presence | Absence | 0.21 | 94.2 |
| Example 14 | TiO$_2$ | Presence | Absence | 1.99 | 97.6 |
| Example 15 | TiO$_2$ | Presence | Absence | 6.96 | 98.6 |
| Example 16 | TiO$_2$ | Presence | Absence | 11.12 | 98.8 |
| Conventional Example 1 | TiN | Absence | Absence | 0.00 | 83.7 |

TABLE 4

| | Interface observation result Ti compound layer | Interface observation result Ag particles | Interface observation result Cu particles | Concentration of Ag in near interface region [at %] | Bonding rate [%] |
|---|---|---|---|---|---|
| Example 21 | TiN | Presence | Absence | 0.15 | 93.1 |
| Example 22 | TiN | Presence | Presence | 0.34 | 97.2 |
| Example 23 | TiN | Presence | Presence | 6.99 | 98.0 |
| Example 24 | TiN | Presence | Presence | 8.50 | 94.4 |
| Example 25 | TiN | Presence | Presence | 0.12 | 91.1 |
| Example 26 | TiN | Presence | Presence | 1.22 | 97.0 |
| Example 27 | TiN | Presence | Presence | 6.21 | 96.3 |
| Example 28 | TiN | Presence | Absence | 8.87 | 93.4 |
| Example 29 | TiN | Presence | Absence | 8.55 | 95.5 |
| Example 30 | TiN | Presence | Presence | 1.43 | 97.8 |
| Example 31 | TiO$_2$ | Presence | Absence | 0.27 | 92.3 |
| Example 32 | TiO$_2$ | Presence | Absence | 3.07 | 91.5 |
| Example 33 | TiO$_2$ | Presence | Presence | 7.08 | 91.9 |
| Example 34 | TiO$_2$ | Presence | Presence | 12.04 | 96.7 |
| Example 35 | TiO$_2$ | Presence | Absence | 0.18 | 91.0 |
| Example 36 | TiO$_2$ | Presence | Absence | 2.03 | 97.1 |
| Example 37 | TiO$_2$ | Presence | Absence | 8.00 | 96.0 |
| Example 38 | TiO$_2$ | Presence | Absence | 9.90 | 98.5 |
| Example 39 | TiO$_2$ | Presence | Absence | 8.90 | 97.9 |
| Example 40 | TiO$_2$ | Presence | Presence | 2.98 | 92.1 |
| Conventional Example 2 | TiN | Absence | Absence | 0.02 | 85.6 |

In Conventional Example 1, when a copper plate made of OFC was bonded to a ceramic substrate made of AlN using a Ag—Cu—Ti brazing filler metal, a low temperature holding step of holding a temperature in a temperature range from the eutectic point temperature of Ag and Al to the eutectic point temperature of Ag and Cu was not performed. In such Conventional Example 1, formation of a Ti compound layer made of TiN was confirmed at the interface between the ceramic substrate and the copper plate, but the presence of Ag particles and Cu particles was not confirmed in the Ti compound layer. In addition, the concentration of Ag in the near interface region between the ceramic substrate and the Ti compound layer was 0.00 atomic %. In such Conventional Example 1, the bonding rate was 83.7%.

In contrast, in Examples 2 to 7, when a copper plate made of OFC was bonded to a ceramic substrate made of AlN using a Ag—Cu—Ti brazing filler metal, a low temperature holding step of holding a temperature in a temperature range from the eutectic point temperature of Ag and Al to the eutectic point temperature of Ag and Cu was performed. In such Examples 2 to 7, formation of a Ti compound layer made of TiN was confirmed at the interface between the ceramic substrate and the copper plate and Ag particles and Cu particles in the Ti compound layer were observed. In addition, the concentration of Ag in the near interface region between the ceramic substrate and the Ti compound layer was 0.15 atomic % to 12.28 atomic %. In such Examples 2 to 7, the bonding rate was 92.1% to 97.6% and an improvement in the bonding rate was confirmed compared to Conventional Examples.

In Examples 1 and 8, when a copper plate made of TPC or OFC was bonded to a ceramic substrate made of AlN using a Ag—Ti brazing filler metal, a low temperature holding step of holding a temperature in a temperature range from the eutectic point temperature of Ag and Al to the eutectic point temperature of Ag and Cu was performed. In such Examples 1 and 8, formation of a Ti compound layer made of TiN was confirmed at the interface between the ceramic substrate and the copper plate and Ag particles were observed in the Ti compound layer. In addition, the concentration of Ag in the near interface region between the ceramic substrate and the Ti compound layer was 0.13 atomic % to 10.56 atomic %. In such Examples 1 and 8, the bonding rate was 93.3% and 98.0% respectively and an improvement in the bonding rate was confirmed compared to Conventional Examples.

In Examples 9, 10, and 13 to 16, when a copper plate made of OFC was bonded to a ceramic substrate made of $Al_2O_3$ using a Ag—Ti brazing filler metal, a low temperature holding step of holding a temperature in a temperature range from the eutectic point temperature of Ag and Al to the eutectic point temperature of Ag and Cu was performed. In such Examples 9, 10, and 13 to 16, formation of a Ti compound layer made of $TiO_2$ was confirmed at the interface between the ceramic substrate and the copper plate and Ag particles were observed in the Ti compound layer. In addition, the concentration of Ag in the near interface region between the ceramic substrate and the Ti compound layer was 0.21 atomic % to 11.12 atomic %. In such Examples 9, 10, and 13 to 16, the bonding rate was 91.1% to 98.8% and an improvement in the bonding rate was confirmed compared to Conventional Examples.

In Examples 11 and 12, when a copper plate made of OFC was bonded to a ceramic substrate made of $Al_2O_3$ using a Ag—Cu—Ti brazing filler metal, a low temperature holding step of holding a temperature in a temperature range from the eutectic point temperature of Ag and Al to the eutectic point temperature of Ag and Cu was performed. In such Examples 11 and 12, formation of a Ti compound layer made of $TiO_2$ was confirmed at the interface between the ceramic substrate and the copper plate and Ag particles and Cu particles were observed in the Ti compound layer. In addition, the concentration of Ag in the near interface region between the ceramic substrate and the Ti compound layer was 9.08 atomic % and 11.36 atomic %. In such Examples 11 and 12, the bonding rate was 97.5% and 98.7% respectively and an improvement in the bonding rate was confirmed compared to Conventional Examples.

As shown in Tables 2 and 4, even in the cases of using the Ag—Ti-based paste, the Ag—Cu—Ti-based paste, and the Ag—$TiH_2$-based paste, as in the case of using a brazing filler metal foil, as a result, an improvement in the bonding rate was confirmed compared to Conventional Examples.

INDUSTRIAL APPLICABILITY

According to the present invention, it is possible to provide a Cu/ceramic bonded body in which a copper member and a ceramic member are reliably bonded, a method for manufacturing the Cu/ceramic bonded body, and a power module substrate made of the Cu/ceramic bonded body. The Cu/ceramic bonded body and the power module substrate according to the present invention are suitable for power semiconductor elements for controlling higher amounts of power used to control wind power generation, electric automobiles, hybrid automobiles, and the like.

REFERENCE SIGNS LIST 10, 110, 210: POWER MODULE SUBSTRATE
11, 111, 211: CERAMIC SUBSTRATE
12, 112, 212: CIRCUIT LAYER
13, 113: METAL LAYER
22, 122, 123, 222: COPPER PLATE
24: Ag—Cu—Ti-BASED BRAZING FILLER METAL
31, 131, 231: Ti COMPOUND LAYER
31A, 131A, 231A: NEAR INTERFACE REGION
35, 135, 235: Ag PARTICLE
36: Cu PARTICLE
124: Ag—Ti-BASED BRAZING FILLER METAL
224: Ag—Ti-BASED BRAZING FILLER METAL PASTE

The invention claimed is:

1. A Cu/ceramic bonded body formed by bonding a copper member made of copper or a copper alloy and a ceramic member made of AlN or $Al_2O_3$ using a bonding material containing Ag and Ti,
    wherein a Ti compound layer made of a Ti nitride or a Ti oxide is formed at a bonding interface between the copper member and the ceramic member, and
    Ag particles are dispersed in the Ti compound layer.

2. The Cu/ceramic bonded body according to claim 1, wherein the concentration of Ag in a near interface region from the interface with the ceramic member to 500 nm in the Ti compound layer is 0.3 atomic % or more.

3. The Cu/ceramic bonded body according to claim 1, wherein the particle size of the Ag particles dispersed in the Ti compound layer is in a range from 10 nm to 100 nm.

4. The Cu/ceramic bonded body according to claim 1, wherein the bonding material further contains Cu and Cu particles are dispersed in the Ti compound layer.

5. A method for manufacturing the Cu/ceramic bonded body according to claim 1, comprising:
    a low temperature holding step of holding a temperature in a temperature range from a eutectic point temperature of Ag and Al to a temperature lower than an eutectic point temperature of Ag and Cu in a state in which a bonding material containing Ag and Ti is interposed between the copper member and the ceramic member and the copper member and the ceramic member are compressed in the lamination direction under pressure in a range from $4.9 \times 10^4$ Pa to $343 \times 10^4$ Pa, and of forming a Ti compound layer made of a Ti nitride or a Ti oxide at a bonding interface between the copper member and the ceramic member;
    a heating step of, after the low temperature holding step, performing heating to a temperature equal to or higher than the eutectic point temperature of Ag and Cu to melt the bonding material; and
    a cooling step of, after the heating step, performing cooling and solidifying the melted bonding material to bond the copper member to the ceramic member, and Ag particles are dispersed in the Ti compound layer formed in the low temperature holding step.

6. The method for manufacturing the Cu/ceramic bonded body according to claim 5, wherein the holding time in the low temperature holding step is in a range from 30 minutes to 5 hours.

7. The method for manufacturing the Cu/ceramic bonded body according to claim 5,
wherein the heating temperature in the heating step is in a range from 790° C. to 830° C.

8. A power module substrate formed by bonding a copper plate made of copper or a copper alloy to a surface of a ceramic substrate made of AlN or $Al_2O_3$, the substrate comprising:
the Cu/ceramic bonded body according to claim 1.

9. The Cu/ceramic bonded body according to claim 2,
wherein the particle size of the Ag particles dispersed in the Ti compound layer is in a range from 10 nm to 100 nm.

10. The Cu/ceramic bonded body according to claim 2,
wherein the bonding material further contains Cu and Cu particles are dispersed in the Ti compound layer.

11. The Cu/ceramic bonded body according to claim 3,
wherein the bonding material further contains Cu and Cu particles are dispersed in the Ti compound layer.

12. The Cu/ceramic bonded body according to claim 9,
wherein the bonding material further contains Cu and Cu particles are dispersed in the Ti compound layer.

13. A method for manufacturing the Cu/ceramic bonded body according to claim 2, comprising:
a low temperature holding step of holding a temperature in a temperature range from a eutectic point temperature of Ag and Al to a temperature lower than an eutectic point temperature of Ag and Cu in a state in which a bonding material containing Ag and Ti is interposed between the copper member and the ceramic member and the copper member and the ceramic member are compressed in the lamination direction under pressure in a range from $4.9 \times 10^4$ Pa to $343 \times 10^4$ Pa, and of forming a Ti compound layer made of a Ti nitride or a Ti oxide at a bonding interface between the copper member and the ceramic member;
a heating step of, after the low temperature holding step, performing heating to a temperature equal to or higher than the eutectic point temperature of Ag and Cu to melt the bonding material; and
a cooling step of, after the heating step, performing cooling and solidifying the melted bonding material to bond the copper member to the ceramic member, and
Ag particles are dispersed in the Ti compound layer formed in the low temperature holding step.

14. A method for manufacturing the Cu/ceramic bonded body according to claim 3, comprising:
a low temperature holding step of holding a temperature in a temperature range from a eutectic point temperature of Ag and Al to a temperature lower than an eutectic point temperature of Ag and Cu in a state in which a bonding material containing Ag and Ti is interposed between the copper member and the ceramic member and the copper member and the ceramic member are compressed in the lamination direction under pressure in a range from $4.9 \times 10^4$ Pa to $343 \times 10^4$ Pa, and of forming a Ti compound layer made of a Ti nitride or a Ti oxide at a bonding interface between the copper member and the ceramic member;
a heating step of, after the low temperature holding step, performing heating to a temperature equal to or higher than the eutectic point temperature of Ag and Cu to melt the bonding material; and
a cooling step of, after the heating step, performing cooling and solidifying the melted bonding material to bond the copper member to the ceramic member, and
Ag particles are dispersed in the Ti compound layer formed in the low temperature holding step.

15. A method for manufacturing the Cu/ceramic bonded body according to claim 4, comprising:
a low temperature holding step of holding a temperature in a temperature range from a eutectic point temperature of Ag and Al to a temperature lower than an eutectic point temperature of Ag and Cu in a state in which a bonding material containing Ag and Ti is interposed between the copper member and the ceramic member and the copper member and the ceramic member are compressed in the lamination direction under pressure in a range from $4.9 \times 10^4$ Pa to $343 \times 10^4$ Pa, and of forming a Ti compound layer made of a Ti nitride or a Ti oxide at a bonding interface between the copper member and the ceramic member;
a heating step of, after the low temperature holding step, performing heating to a temperature equal to or higher than the eutectic point temperature of Ag and Cu to melt the bonding material; and
a cooling step of, after the heating step, performing cooling and solidifying the melted bonding material to bond the copper member to the ceramic member, and
Ag particles are dispersed in the Ti compound layer formed in the low temperature holding step.

16. A method for manufacturing the Cu/ceramic bonded body according to claim 9, comprising:
a low temperature holding step of holding a temperature in a temperature range from a eutectic point temperature of Ag and Al to a temperature lower than an eutectic point temperature of Ag and Cu in a state in which a bonding material containing Ag and Ti is interposed between the copper member and the ceramic member and the copper member and the ceramic member are compressed in the lamination direction under pressure in a range from $4.9 \times 10^4$ Pa to $343 \times 10^4$ Pa, and of forming a Ti compound layer made of a Ti nitride or a Ti oxide at a bonding interface between the copper member and the ceramic member;
a heating step of, after the low temperature holding step, performing heating to a temperature equal to or higher than the eutectic point temperature of Ag and Cu to melt the bonding material; and
a cooling step of, after the heating step, performing cooling and solidifying the melted bonding material to bond the copper member to the ceramic member, and
Ag particles are dispersed in the Ti compound layer formed in the low temperature holding step.

17. The method for manufacturing the Cu/ceramic bonded body according to claim 6,
wherein the heating temperature in the heating step is in a range from 790° C. to 830° C.

18. A power module substrate formed by bonding a copper plate made of copper or a copper alloy to a surface of a ceramic substrate made of AlN or $Al_2O_3$, the substrate comprising:
the Cu/ceramic bonded body according to claim 2.

19. A power module substrate formed by bonding a copper plate made of copper or a copper alloy to a surface of a ceramic substrate made of AlN or $Al_2O_3$, the substrate comprising:
the Cu/ceramic bonded body according to claim 3.

20. A power module substrate formed by bonding a copper plate made of copper or a copper alloy to a surface of a ceramic substrate made of AlN or $Al_2O_3$, the substrate comprising:
the Cu/ceramic bonded body according to claim 4.

21. The Cu/ceramic bonded body according to claim 1, wherein a Ag-Cu eutectic layer is formed on a surface of the Ti compound layer opposite to a surface the ceramic member is bonded.

22. The Cu/ceramic bonded body according to claim 1, wherein the Ti compound layer is made of the Ti nitride.

23. The Cu/ceramic bonded body according to claim 2, wherein 90% or more of the Ag particles dispersed in the Ti compound layer is distributed in the near interface region.

* * * * *